(12) United States Patent
Teig et al.

(10) Patent No.: US 6,516,455 B1
(45) Date of Patent: Feb. 4, 2003

(54) PARTITIONING PLACEMENT METHOD USING DIAGONAL CUTLINES

(75) Inventors: Steven Teig, Menlo Park, CA (US); Joseph L. Ganley, Vienna, VA (US)

(73) Assignee: Cadence Design Systems, Inc., San Jose, CA (US)

(*) Notice: Subject to any disclaimer, the term of this patent is extended or adjusted under 35 U.S.C. 154(b) by 58 days.

(21) Appl. No.: 09/854,182

(22) Filed: May 10, 2001

Related U.S. Application Data

(63) Continuation-in-part of application No. 09/731,891, filed on Dec. 6, 2000.

(51) Int. Cl.$^7$ .............................................. G06F 17/50
(52) U.S. Cl. .................. 716/7; 716/9; 716/10
(58) Field of Search ............................. 716/7, 8, 12, 9, 716/10

(56) References Cited

U.S. PATENT DOCUMENTS 5,757,656 A * 5/1998 Hershberger et al. ......... 716/13

FOREIGN PATENT DOCUMENTS

JP 64-15947 * 1/1989

* cited by examiner

Primary Examiner—Tom Thomas
Assistant Examiner—Thien F Tran
(74) Attorney, Agent, or Firm—Stattler, Johansen & Adeli LLP

(57) ABSTRACT

Some embodiments of the invention are placers that use diagonal lines in calculating the cost of potential placement configurations. For instance, some embodiments estimate the wirelength cost of a placement configuration by (1) identifying, for each net list, a bounding box that encloses all the circuit elements of the net, (2) computing an attribute of each bounding box by using a line that can be completely or partially diagonal, and (3) computing the wirelength cost estimate based on the computed attributes. To estimate the wirelength cost of different placement configurations, other embodiments construct connection graphs that model the net interconnect topologies. These connection graphs can have edges that are completely or partially diagonal. Other embodiments use diagonal lines to measure congestion costs of potential placement configurations. For instance, some placers use diagonal lines as cut lines that divide the IC layout into regions. These placers then generate congestion-cost estimates by measuring the number of nets cut by the diagonal cut lines.

17 Claims, 32 Drawing Sheets

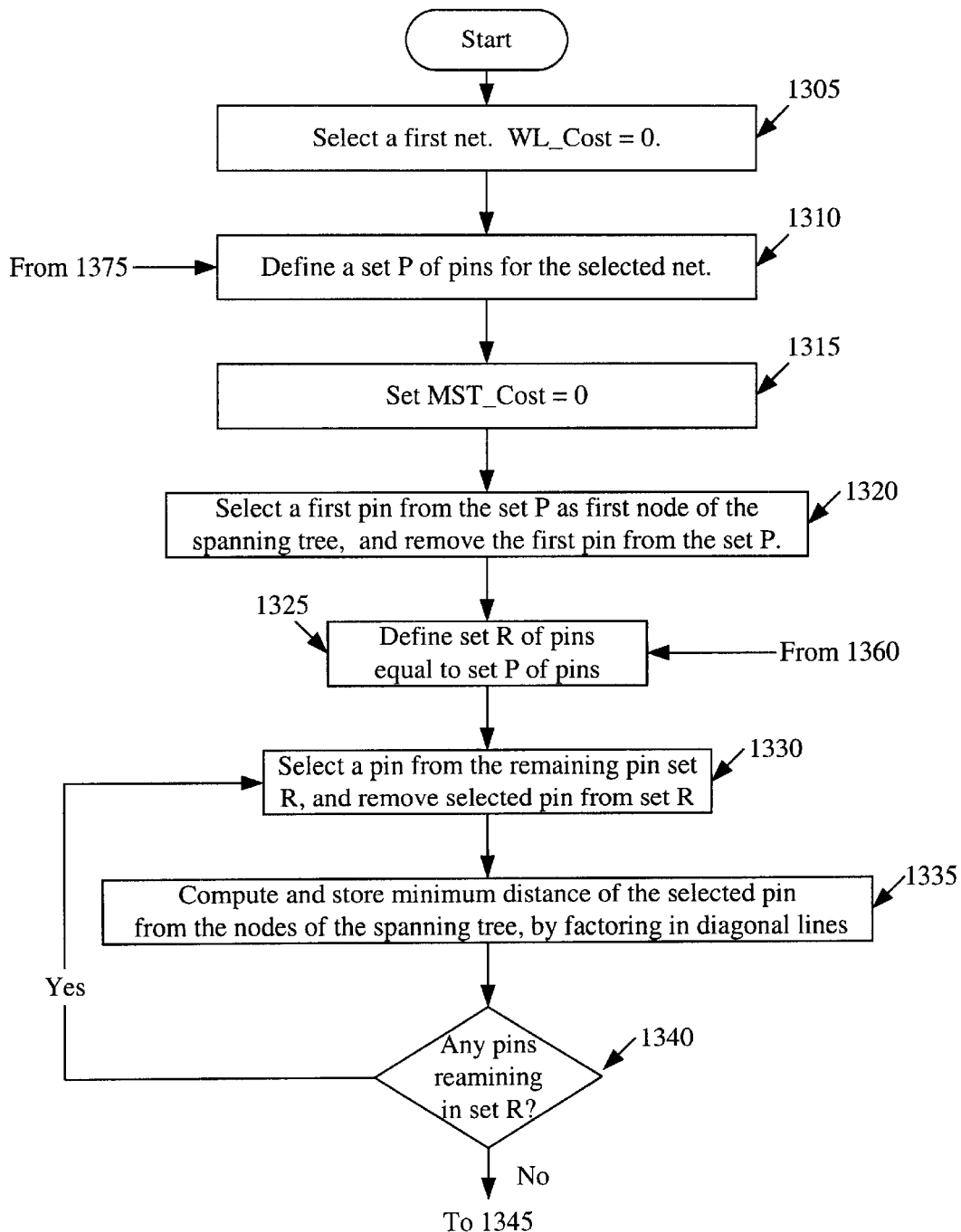

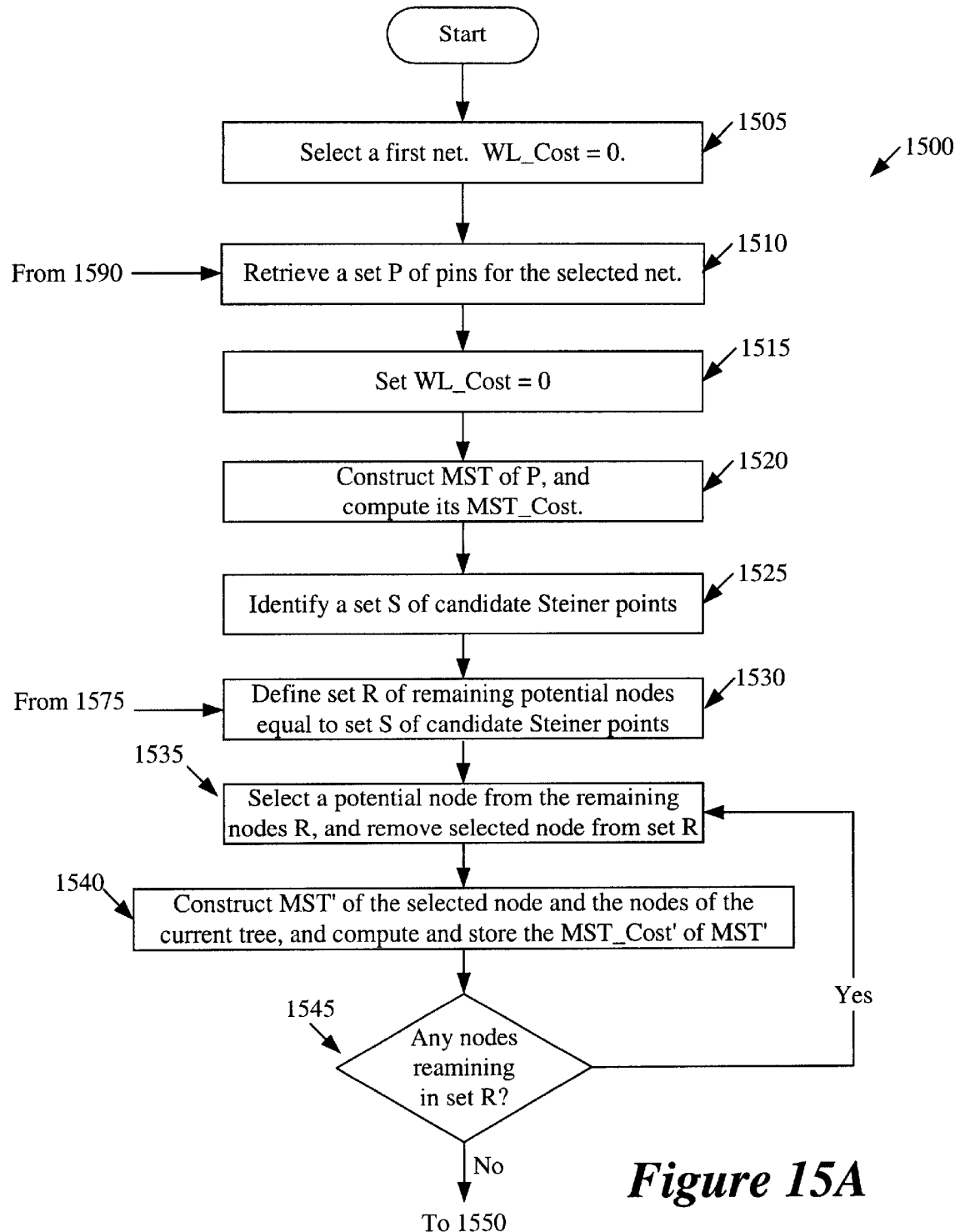
Figure 15: Figure 15A / Figure 15B

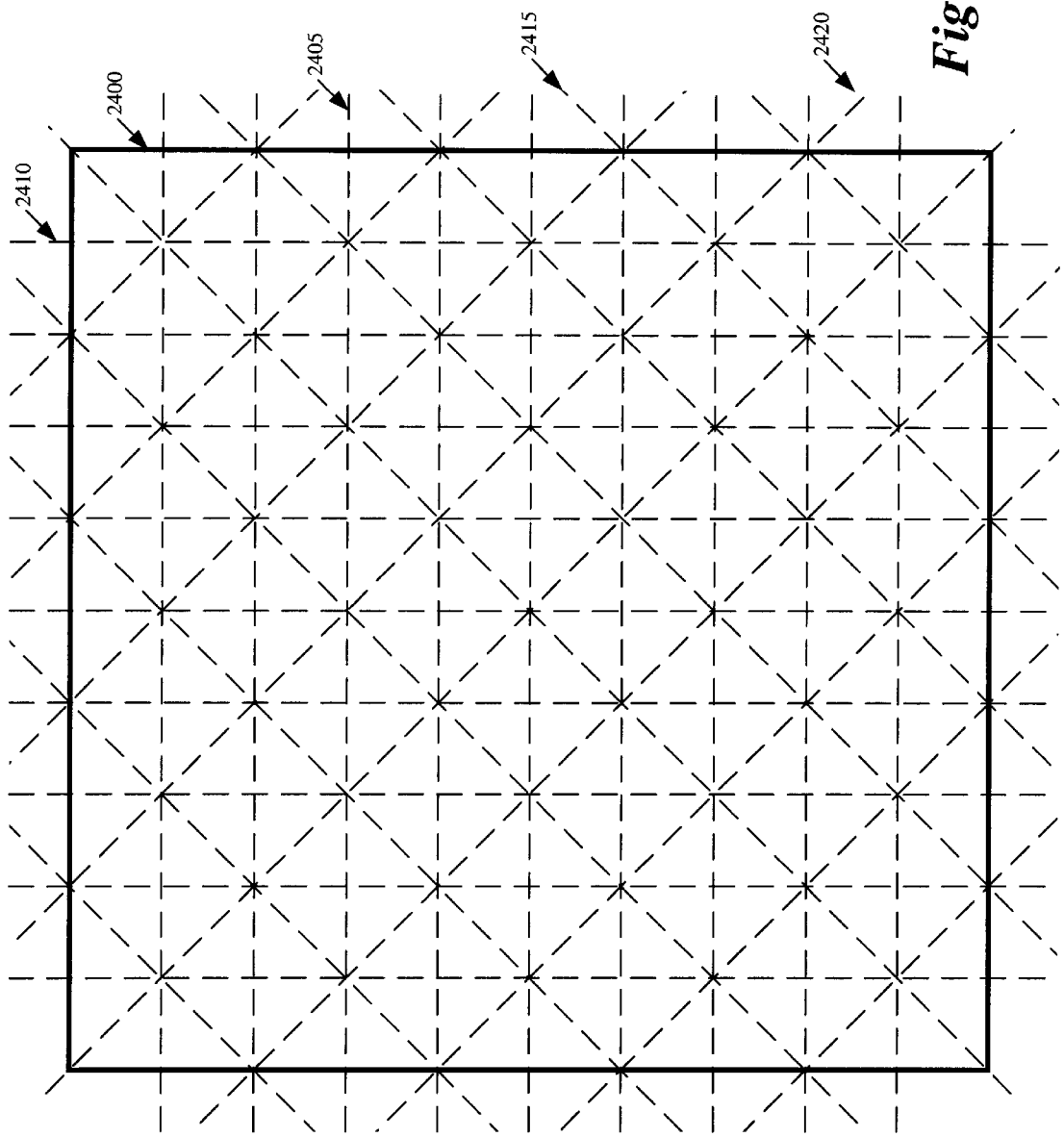

| *Figure 25:* | *Figure 25A* |
|---|---|
| | *Figure 25B* |

PARTITIONING PLACEMENT METHOD USING DIAGONAL CUTLINES

CROSS REFERENCE TO RELATED APPLICATION

This application is a continuation-in-part application of United States Patent Application entitled "Method and Apparatus for Considering Diagonal Wiring in Placement," filed on Dec. 6, 2000, and having the Ser. No. 09/731,891.

FIELD OF THE INVENTION

The invention is directed towards methods and apparatuses for placing circuit modules in integrated-circuit modules.

BACKGROUND OF THE INVENTION

An integrated circuit ("IC") is a semiconductor device that includes many electronic components (e.g., transistors, resistors, diodes, etc.). These components are often interconnected to form multiple circuit components (e.g., gates, cells, memory units, arithmetic units, controllers, decoders, etc.) on the IC. The electronic and circuit components of IC's are jointly referred to below as "components."

An IC also includes multiple layers of metal and/or polysilicon wiring (collectively referred to below as "metal layers") that interconnect its electronic and circuit components. For instance, many IC's are currently fabricated with five metal layers. In theory, the wiring on the metal layers can be all-angle wiring (i.e., the wiring can be in any arbitrary direction). Such all-angle wiring is commonly referred to as Euclidean wiring. In practice, however, each metal layer typically has a preferred wiring direction, and the preferred direction alternates between successive metal layers. Many IC's use the Manhattan wiring model, which specifies alternating layers of preferred-direction horizontal and vertical wiring. In this wiring model, the majority of the wires can only make 90° turns. However, occasional diagonal jogs are sometimes allowed on the preferred horizontal and vertical layers.

Design engineers design IC's by transforming circuit description of the IC's into geometric descriptions, called layouts. To create layouts, design engineers typically use electronic design automation ("EDA") applications. These applications provide sets of computer-based tools for creating, editing, and analyzing IC design layouts.

EDA applications create layouts by using geometric shapes that represent different materials and devices on IC's. For instance, EDA tools commonly use rectangular lines to represent the wire segments that interconnect the IC components. These tools also represent electronic and circuit IC components as geometric objects with varying shapes and sizes. For the sake of simplifying the discussion, these geometric objects are shown as rectangular blocks in this document.

Also, in this document, the phrase "circuit module" refers to the geometric representation of an electronic or circuit IC component by an EDA application. EDA applications typically illustrate circuit modules with pins on their sides. These pins connect to the interconnect lines.

A net is typically defined as a collection of pins that need to be electrically connected. A list of all or some of the nets in a layout is referred to as a net list. In other words, a net list specifies a group of nets, which, in turn, specify the interconnections between a set of pins.

FIG. 1 illustrates an example of an IC layout 100. This layout includes five circuit modules 105, 110, 115, 120, and 125 with pins 130–160. Four interconnect lines 165–180 connect these modules through their pins. In addition, three nets specify the interconnection between the pins. Specifically, pins 135, 145, and 160 define a three-pin net, while pins 130 and 155, and pins 140 and 150 respectively define two two-pin nets. As shown in FIG. 1, a circuit module (such as 105) can have multiple pins on multiple nets.

The IC design process entails various operations. Some of the physical-design operations that EDA applications commonly perform to obtain the IC layouts are: (1) circuit partitioning, which partitions a circuit if the circuit is too large for a single chip; (2) floor planning, which finds the alignment and relative orientation of the circuit modules; (3) placement, which determines more precisely the positions of the circuit modules; (4) routing, which completes the interconnects between the circuit modules; (5) compaction, which compresses the layout to decrease the total IC area; and (6) verification, which checks the layout to ensure that it meets design and functional requirements.

Placement is a key operation in the physical design cycle. It is the process of arranging the circuit modules on a layout, in order to achieve certain objectives, such as reducing layout area, wirelength, wire congestion, etc. A poor placement configuration not only can consume a large area, but it also can make routing difficult and result in poor performance.

Numerous EDA placers have been proposed to date. Certain placers are constrained-optimization placers, which (1) use cost-calculating functions to generate placement scores (i.e., placement costs) that quantify the quality of placement configurations, and (2) use optimization algorithms to modify iteratively the placement configurations to improve the placement scores generated by the cost-calculating functions.

A constrained-optimization placer typically receives (1) a list of circuit modules, (2) an initial placement configuration for these modules, and (3) a net list that specifies the interconnections between the modules. The initial placement configuration can be random (i.e., all the modules can be positioned randomly). Alternatively, the initial configuration can be partially or completely specified by a previous physical-design operation, such as the floor planning.

A constrained-optimization placer then uses a cost-calculating function to measure the quality of the initial placement configuration. The cost function generates a metric score that is indicative of the placement quality. Different cost-calculating functions measure different placement metrics. For instance, as further described below, some functions measure wirelength (e.g., measure each net's minimum spanning tree, Steiner tree, or bounding-box perimeter, etc.), while others measure congestion (e.g., measure number of nets intersected by cut lines).

After calculating the metric cost of the initial placement configuration, a constrained-optimization placer uses an optimization algorithm to modify iteratively the placement configuration to improve the placement score generated by its cost-calculating function. Different optimization techniques modify the placement configuration differently. For instance, at each iteration, some techniques move one circuit module, others swap two modules, and yet others move a number of related modules. Also, at each iteration, some optimization techniques (e.g., KLFM and tabu search algorithms) search for the best move, while others (e.g., simulated annealing and local optimization) select random moves. In addition, some techniques (e.g., simulated.annealing) accept moves that make the metric score worse, whereas others (e.g., local optimization) do not.

Five types of constrained-optimization placement techniques are described below.

A. Min-Cut Bipartitioning.

Some placers use min-cut bipartitioning. This technique uses horizontal and vertical cut lines to partition the IC layout recursively into successive pairs of regions. At each level of the recursion, this technique then moves the circuit modules between the regions at that level, in order to reduce the number of nets intersected by the cut line for that level. By minimizing the net-cut cost at each level of the recursion, these techniques reduce the wire congestion across the cut lines.

FIGS. 2 and 3 illustrate one example of min-cut bipartitioning. FIG. 2 illustrates an IC layout 200 that is partitioned initially in two regions 210 and 215 by a vertical cut line 205. After defining this initial cut line, the min-cut bipartitioning method calculates the number of nets that are intersected by this cut line. This number is indicative of the wire congestion about this cut line. An optimization algorithm (such as KLFM) is then used to modify the initial placement iteratively (i.e., to move the circuit modules iteratively), in order to minimize the net-cut cost across the initial cut line 205.

Once the congestion across the initial cut line is minimized, the min-cut bipartitioning method is applied recursively to the two regions created by the initial cut line, and then it is applied to the resulting regions created by the succeeding cut lines, and so on. FIG. 3 illustrates the IC layout 200 after it has been recursively partitioned by seven cut lines 205 and 220–245.

B. Non-Recursive Partitioning Method.

Non-recursive partitioning is another technique for calculating congestion costs for placement configurations. As illustrated in FIG. 4, this technique uses several crossing horizontal cutlines 410 and vertical cutlines 415 to define a grid over an IC layout 405. This technique then computes, for each particular cutline, the net-cut cost corresponding to the number of nets cut by the particular cutline. It then squares each computed net-cut cost, and adds the squared costs. The sum of the squared costs provides a congestion cost estimate. An optimization technique can then be used to move the circuit modules to reduce this congestion cost estimate, and thereby reduce the number of nets intersected by the cut lines.

C. Semi-Perimeter Method.

The semi-perimeter method is another cost-calculating function used by some constrained-optimization techniques. This method quickly generates an estimate of the wirelength cost of a placement. For each net, this method typically (1) finds the smallest bounding-box rectangle that encloses all the net's pins, and (2) computes half the perimeter of this bounding rectangle.

FIG. 5 illustrates a bounding box 500 for a net that contains pins 135, 145, and 160 of FIG. 1. The computed semi-perimeter value of this box 500 equals the sum of its width 505 and height 510. This computed semi-perimeter value provides a lower bound estimate on the amount of wire required to route a net.

The semi-perimeter method sums the semi-perimeter values of all the bounding rectangles of all the nets to obtain an estimated wirelength cost for a placement configuration. An optimization technique can then be used to modify iteratively the placement configuration to reduce this wirelength cost estimate, and thereby obtain an acceptable placement configuration.

D. Minimum Spanning Tree.

To estimate the wirelength cost of placement configurations, some constrained-optimization placement techniques compute and add the length of the rectilinear minimum spanning tree ("RMST") for each net. A net's RMST is typically defined as a tree that connects (i.e., spans) the net's pins through the shortest Manhattan wiring route that only branches at the pin locations.

More specifically, the RMST for an N-pin net includes (1) N nodes (also called points or vertices) corresponding to the N pins, and (2) N−1 edges that connect its N nodes. In addition, the edges of the RMST are either horizontal or vertical, and these edges start and end at one of the N nodes of the tree. FIG. 6 illustrates a RMST 605 for the net that contains pins 135, 145, and 160 of FIG. 1.

The sum of the length of the RMST for each net provides an estimate of the wirelength cost of a placement. An optimization algorithm can then be used to modify iteratively the placement configuration to minimize this wirelength cost.

E. Steiner Tree.

Rectilinear Steiner trees are another type of tree structure that constrained-optimization placement techniques generate to estimate the wirelength cost of placement configurations. Rectilinear Steiner trees are similar to RMST's except that Steiner trees do not restrict branching to only pin locations. In rectilinear Steiner trees, a horizontal or vertical edge can branch from a point on an edge that connects two other net pins.

To construct a Steiner tree for an N-pin net, additional points, called Steiner points, are typically added to the net. If R Steiner points are added to the net, the rectilinear Steiner tree for the N-pin net is the RMST on the N+R points. FIG. 7 illustrates a Steiner tree 705 for the net that contains pins 135, 145, and 160 of FIG. 1. In this example, the Steiner point that has been added is point 710.

Heuristic techniques are often used to select the R Steiner points and construct the Steiner tree, since these problems cannot be solved in polynomial time. A heuristic technique is a clever algorithm that only searches inside a subspace of the total search space for a good rather than the best solution that satisfies all design constraints.

Hence, to get an estimate of the wirelength cost of a placement, some constrained-optimization placement techniques use heuristic approximations to identify rectilinear Steiner trees for the nets. The sum of the length of the heuristic Steiner trees for all the nets provides an estimate of the wirelength cost of a placement. An optimization algorithm can then be used to modify iteratively the placement configuration to minimize this wirelength cost.

The above-described placement techniques do not consider diagonal wiring in calculating their placement-configuration cost. Hence, when diagonal routes are selected for the interconnect lines, these techniques result in poor placement configurations, which inefficiently consume the layout area, utilize too much wire, and/or have poor wire congestions. Consequently, there is a need in the art for placers that consider diagonal wiring in calculating their placement-configuration costs.

SUMMARY OF THE INVENTION

Some embodiments of the invention are placers that use diagonal lines in calculating the costs of potential placement configurations. For instance, some embodiments estimate the wirelength cost of a placement configuration by (1) identifying, for each net in a net list, a bounding box that encloses all the circuit elements of the net, (2) computing an attribute of each bounding box by using a line that can be completely or partially diagonal, and (3) computing the wirelength cost estimate based on the computed attributes. To estimate the wirelength cost of different placement configurations, other embodiments construct connection graphs that model the net interconnect topologies. These connection graphs can have edges that are completely or partially diagonal. Other embodiments use diagonal lines to measure congestion costs of potential placement configurations. For instance, some placers use diagonal lines as cut lines that divide the IC layout into regions. These placers then generate congestion-cost estimates by measuring the number of nets cut by the diagonal cut lines.

BRIEF DESCRIPTION OF THE DRAWINGS

The novel features of the invention are set forth in the appended claims. However, for purpose of explanation, several embodiments of the invention are set forth in the following figures.

FIGS. 11, 11A, 11B illustrate a process for generating a wirelength estimate according to a bounding-box method of the invention.

FIGS. 13, 13A, 13B illustrate a process for generating a wirelength estimate by constructing MST's that include horizontal, vertical, and 45° edges.

FIGS. 15, 15A, 15B illustrate a process for generating a wirelength estimate by constructing Steiner trees with 45° diagonal edges.

FIGS. 20, 20A, 20B illustrate a process that generates a congestion cost estimate, and partitions a set of nets, about a cut line.

FIG. 24 illustrates an IC layout that is divided into a number of regions by using a set of intersecting Manhattan lines and a set of intersecting diagonal lines.

FIGS. 25, 25A, 25B illustrate a process for calculating a congestion cost estimate for an embodiment that utilizes a non-recursive partitioning technique.

FIGS. 26, 26A, 26B illustrate one example of a local optimization process.

FIGS. 27, 27A, 27B illustrate one example of a simulated annealing process.

FIGS. 28, 28A, 28B illustrate one example of a KLFM process.

DETAILED DESCRIPTION OF THE INVENTION

Figure 1:
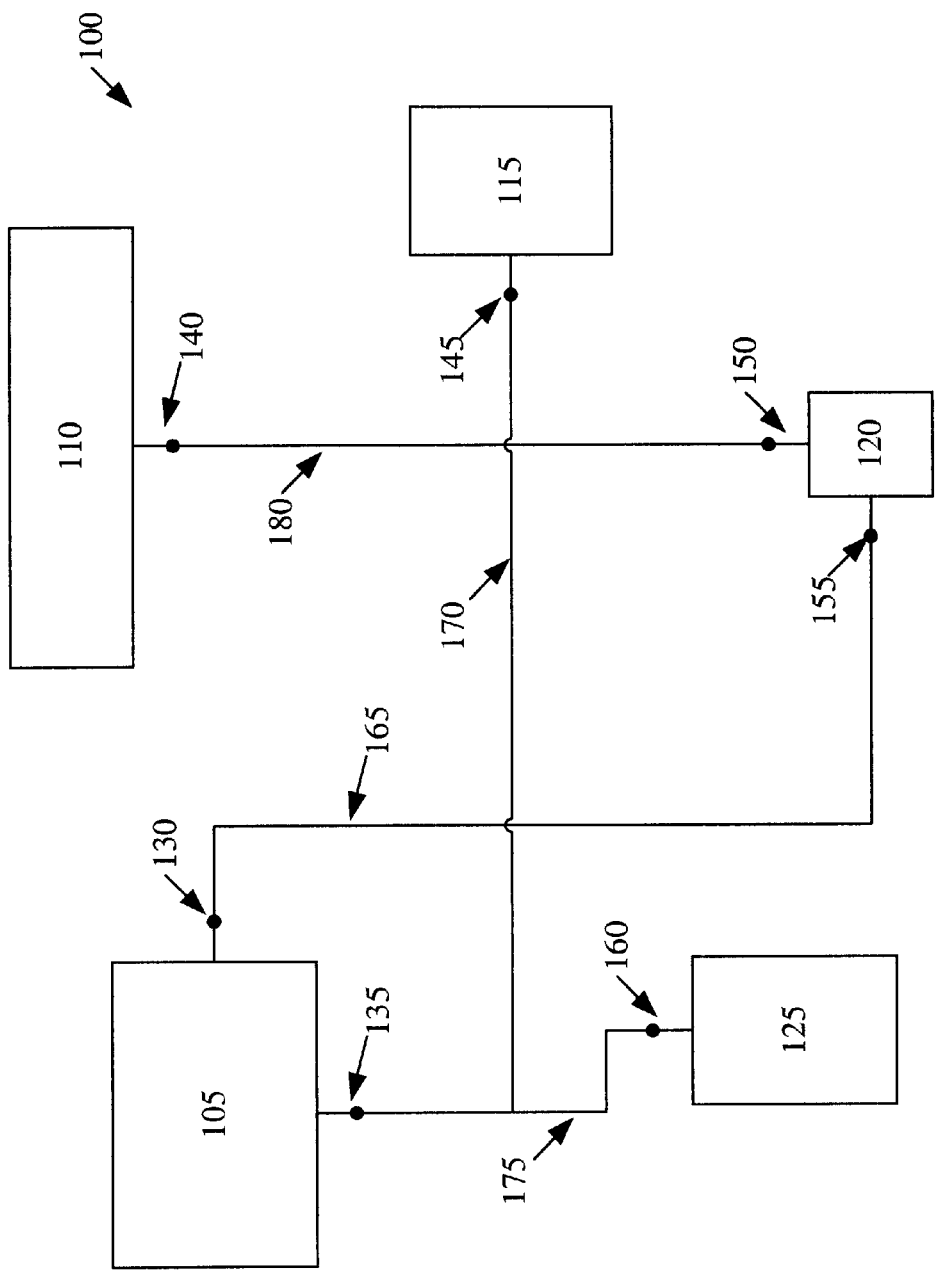
FIG. 1 illustrates an example of an IC layout.
Figure 3:
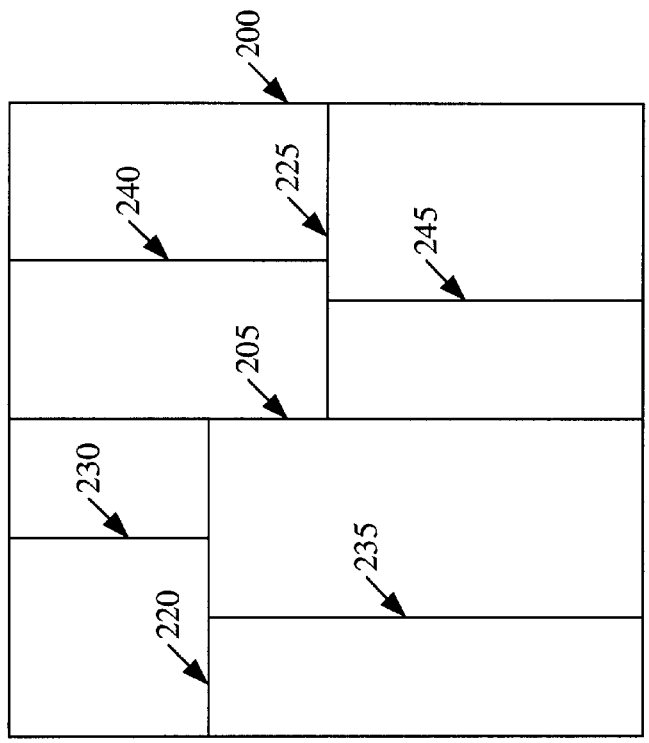
FIG. 3 illustrates the IC layout of FIG. 2 after it has been recursively partitioned by seven cut lines.
Figure 2:
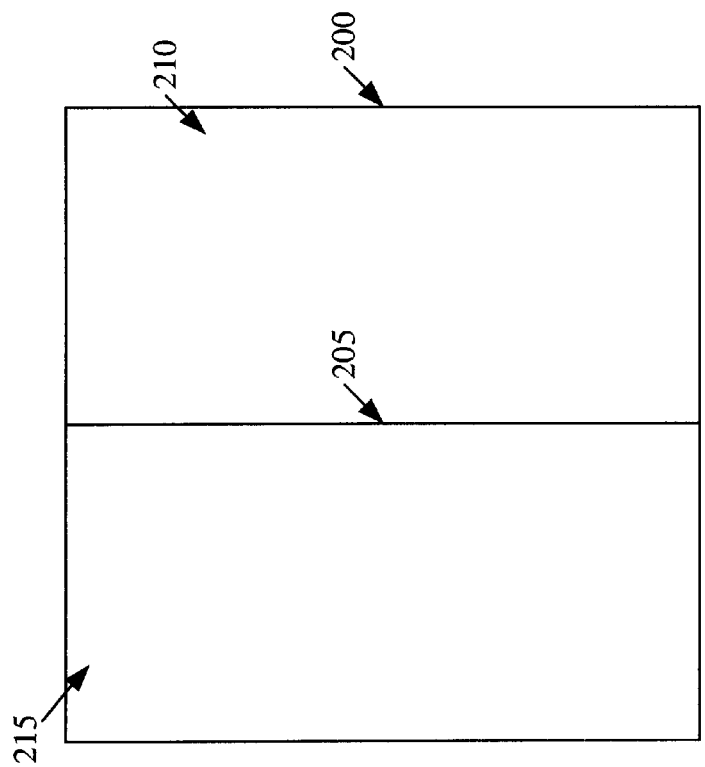
FIG. 2 illustrates an IC layout that is partitioned initially in two regions by a vertical cut line.
Figure 4:
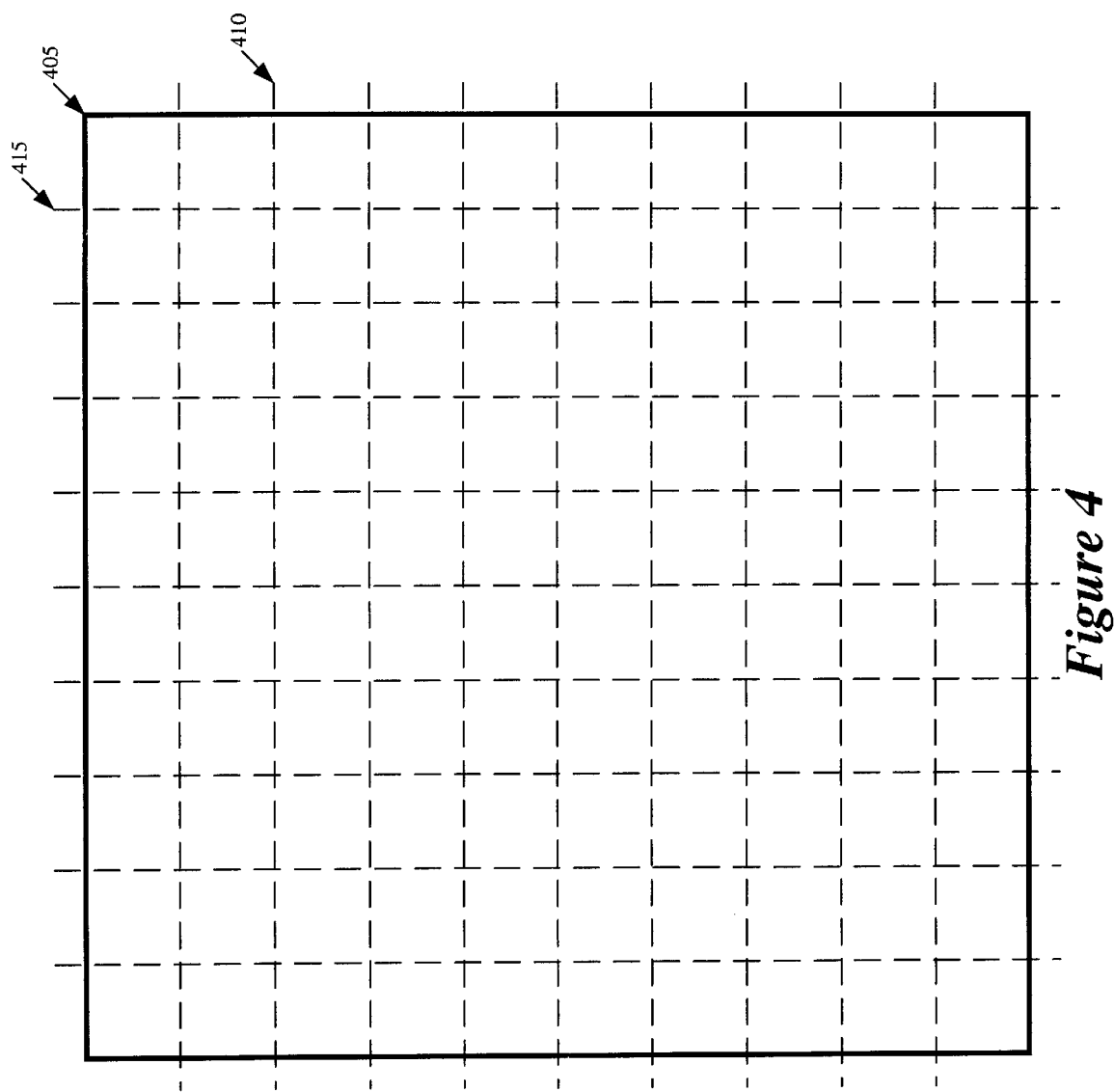
FIG. 4 illustrates several crossing horizontal and vertical cutlines that define a grid over an IC layout.
Figure 5:
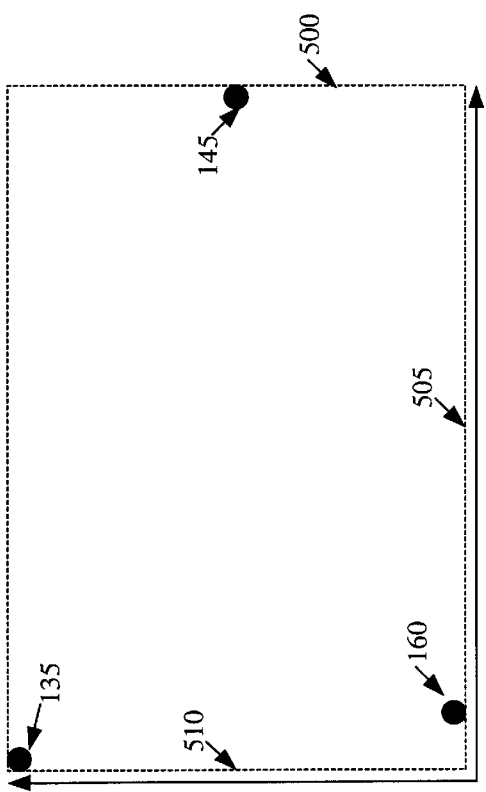
FIG. 5 illustrates a bounding box for a net that contains pins 135, 145, and 160 of FIG. 1.
Figure 6:
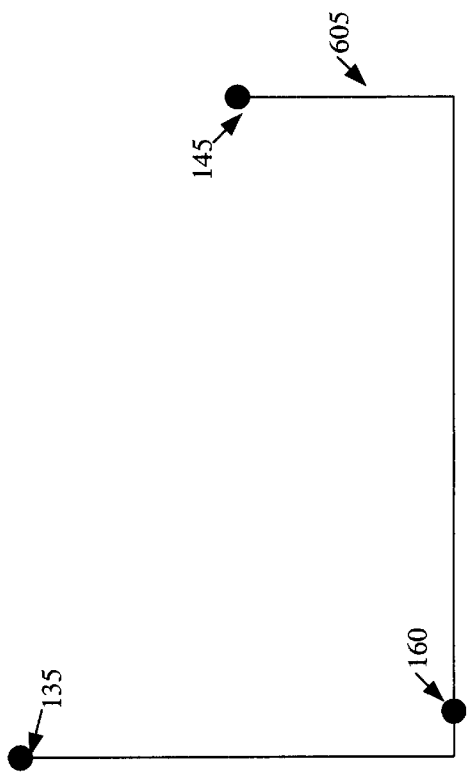
FIG. 6 illustrates a RMST for the net that contains pins 135, 145, and 160 of FIG. 1.
Figure 7:
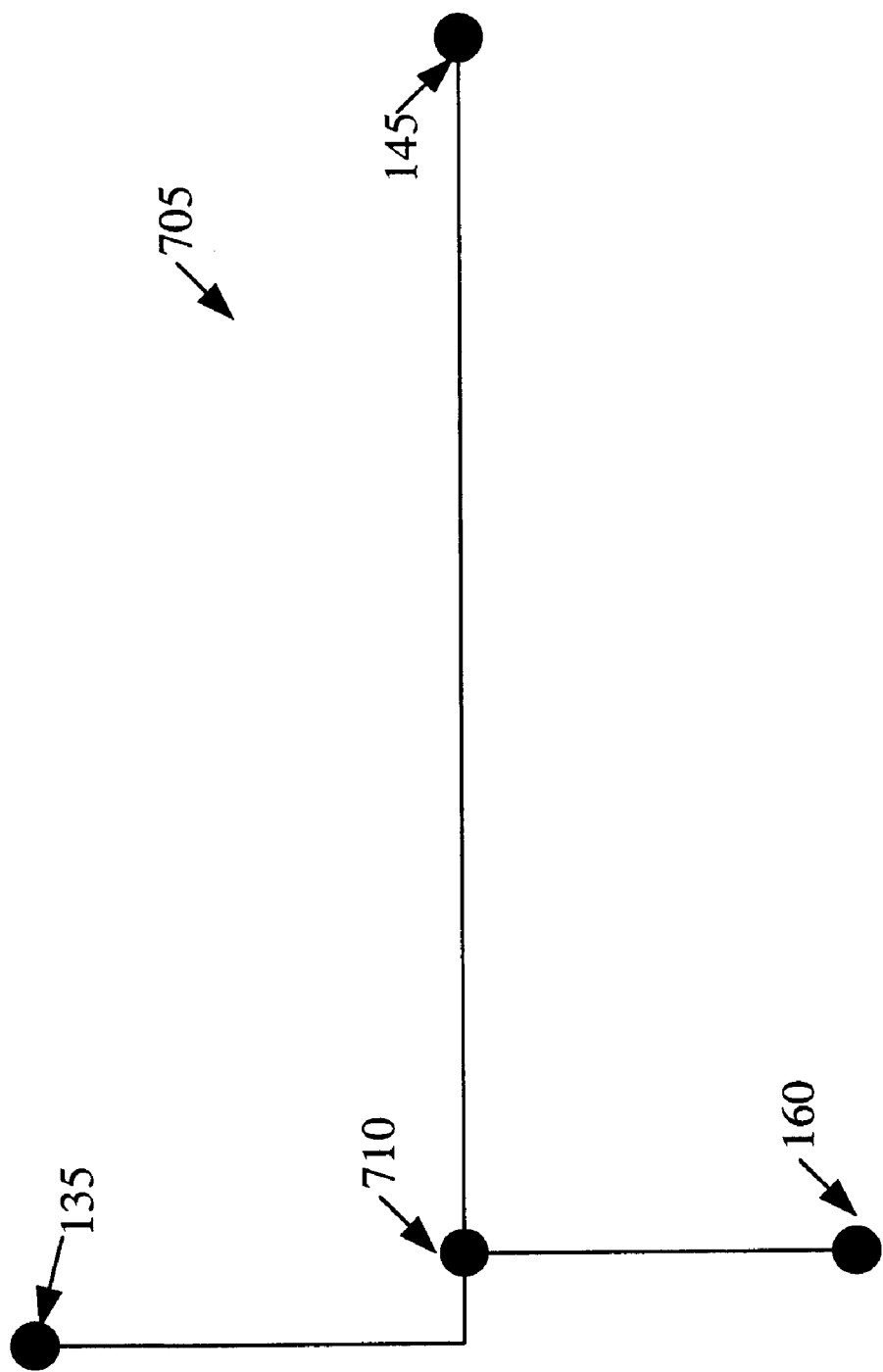
FIG. 7 illustrates a Steiner tree for the net that contains pins 135, 145, and 160 of FIG. 1.

In the following description, numerous details are set forth for purpose of explanation. However, one of ordinary skill in the art will realize that the invention may be practiced without the use of these specific details. In other instances, well-known structures and devices are shown in block diagram form in order not to obscure the description of the invention with unnecessary detail.

Some embodiments of the invention are placers that consider diagonal lines in calculating the costs of potential placement configurations. For instance, some embodiments estimate the wirelength cost of placement configurations by (1) identifying, for each net, a bounding box that encloses all the circuit elements (i.e., pins or circuit modules) of the net, (2) computing an attribute of each bounding box by using a line that can be completely or partially diagonal, and (3) generating a placement cost based on the computed attributes. Section II below discusses several embodiments that use such a bounding-box method.

Other embodiments model potential interconnect topologies to estimate the wirelength cost of different placement configurations. These embodiments construct connection graphs that can have edges that are completely or partially diagonal. Examples of such connection graphs include minimum spanning trees and Steiner trees. Section III presents several such embodiments.

Other embodiments use diagonal lines as cut lines that divide the IC layout into regions. These embodiments then generate congestion-cost estimates by measuring the number of nets cut by the diagonal cut lines. Examples of such embodiments include min-cut bipartitioning with diagonal cutlines, and non-recursive partitioning with diagonal cutlines. Several such embodiments are discussed further below in Sections IV and V.

Before discussing the embodiments presented in Sections II–V, several diagonal-wiring architectures that can be used in conjunction with the invention's cost-calculating methods are described in Section I. Also, Section VI presents several optimization techniques that can be used for optimizing the costs calculated by the cost-calculating methods described in Sections II–V. Section VII then illustrates a computer system used in some embodiments of the invention. Finally, Section VIII describes the advantages of considering diagonal wiring during placement.

I. Diagonal Wiring Architecture

Some embodiments of the invention calculate the cost of placement configurations for IC layouts that have diagonal interconnect lines (i.e., diagonal wiring). In some of these embodiments, the IC layouts not only have diagonal interconnect lines, but also have horizontal and vertical interconnect lines.

As used in this document, an interconnect line is "diagonal" if it forms an angle other than zero or ninety degrees with respect to one of the sides of the layout boundary. On the other hand, an interconnect line is "horizontal" or "vertical" if it forms an angle of 0° or 90° with respect to one of the sides of the layout.

Figure 8:
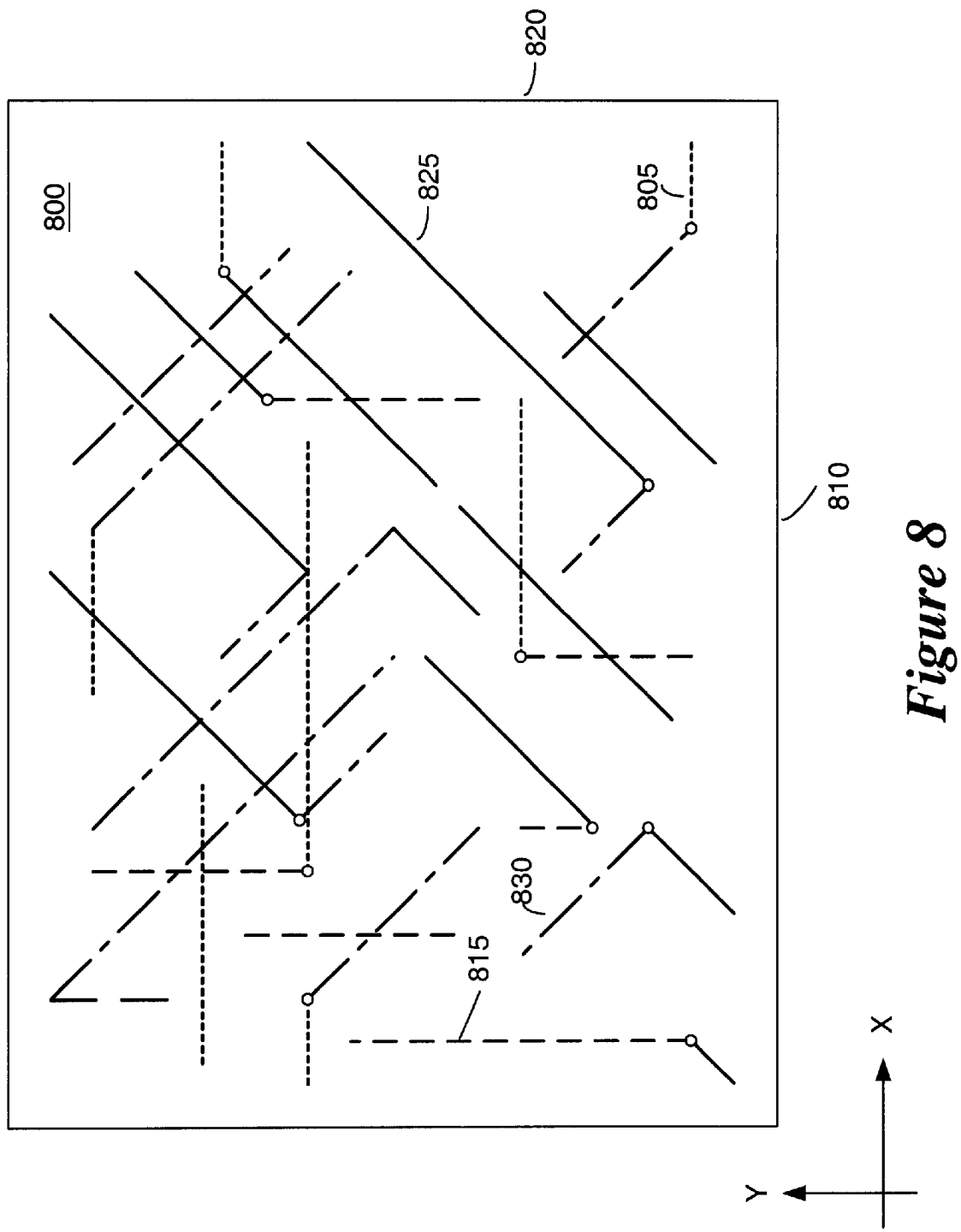
FIG. 8 illustrates the wiring architecture of an IC layout that not only uses diagonal lines, but also uses horizontal and vertical lines.

FIG. 8 illustrates the wiring architecture (i.e., the interconnect-line architecture) of an IC layout 800 that utilizes horizontal, vertical, and 45° diagonal interconnect lines. In this document, this architecture is referred to as the octagonal wiring model, in order to convey that an interconnect line can traverse in eight separate directions from any given point.

The horizontal lines 805 are the lines that are parallel (i.e., are at 0°) to the x-axis, which is defined to be parallel to the width 810 of the layout. The vertical lines 815 are parallel to the y-axis, which is defined to be parallel to the height 820 of the layout. In other words, the vertical interconnect lines 815 are perpendicular (i.e., are at 90°) to the width of the IC layout. In this architecture, one set 825 of diagonal lines are at +45° with respect to the width of the IC layout, while another set 830 are at −45° with respect to the width of the IC layout.

Figure 9:
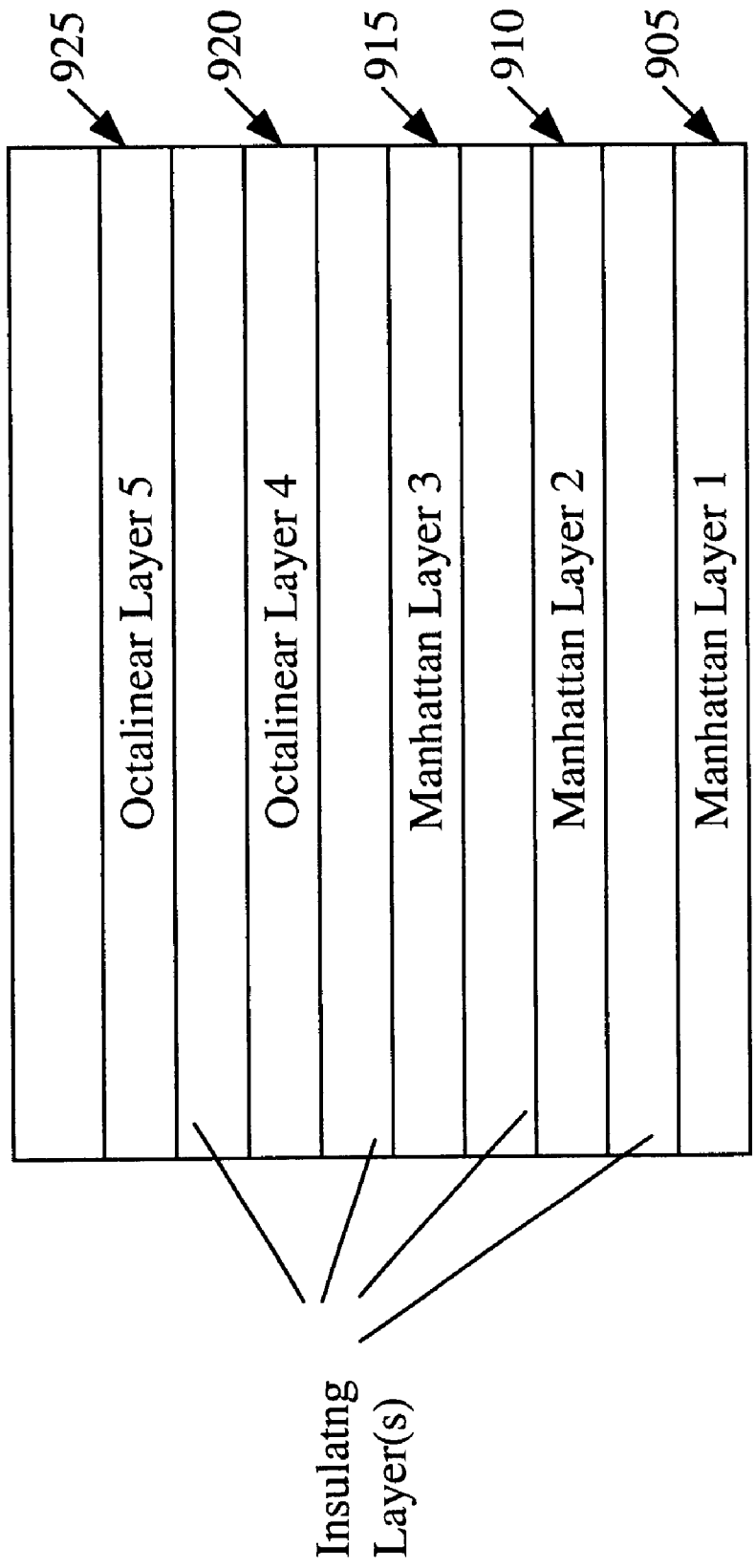
FIG. 9 illustrates one manner of implementing the wiring architecture illustrated in FIG. 8.

FIG. 9 illustrates one manner of implementing the wiring architecture illustrated in FIG. 8 on an IC. Specifically, FIG. 9 illustrates five metal layers for an IC. The first three layers 905–915 are Manhattan layers. In other words, the preferred direction for the wiring in these layers is either the horizontal direction or the vertical direction. The preferred wiring direction in the first three layers typically alternates so that no two consecutive layers have the same direction wiring. However, in some cases, the wiring in consecutive layers is in the same direction.

The next two layers 920 and 925 are diagonal layers. The preferred direction for the wiring in the diagonal layers is ±45°. Also, as in the first three layers, the wiring directions in the fourth and fifth layer are typically orthogonal (i.e., one layer is +45° and the other is −45°), although they do not have to be.

Even though some embodiments of the invention are described below to work with IC layouts that utilize the above-described octagonal wiring model, one of ordinary skill will understand that the invention can be used with any wiring model. For instance, the invention can be used with wiring architectures that are strictly diagonal (i.e., that do not have horizontal and vertical preferred direction wiring). Also, some embodiments are used with non-45° diagonal wiring. For example, some embodiments are used with IC layouts that have horizontal, vertical, and/or ±120° diagonal interconnect lines.

II. Bounding-Box Method

For IC layouts that utilize horizontal, vertical, and diagonal interconnect lines, some embodiments of the invention compute a wirelength-cost estimate for each net in a net list, by (1) identifying a bounding box that encloses all the circuit elements of the net, and (2) computing an attribute of the bounding box by using a line that is at least partially diagonal. These embodiments then generate a wirelength-cost estimate based on the computed attributes of all the nets in the net list. For instance, some embodiments sum the computed attributes to obtain the wirelength-cost estimate for a placement configuration.

Figure 10:
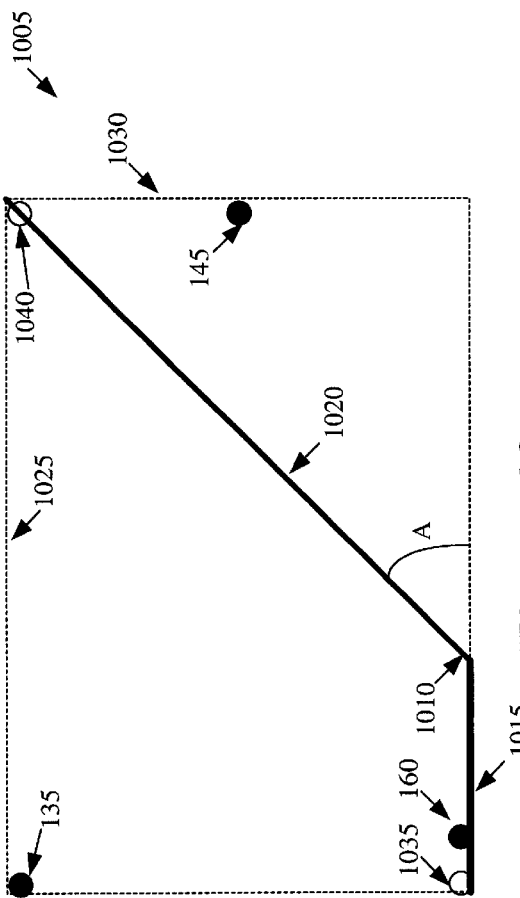
FIG. 10 provides an example of a bounding-box for the net represented by pins 135, 145, and 160 of FIG. 1.
Figure 11A:
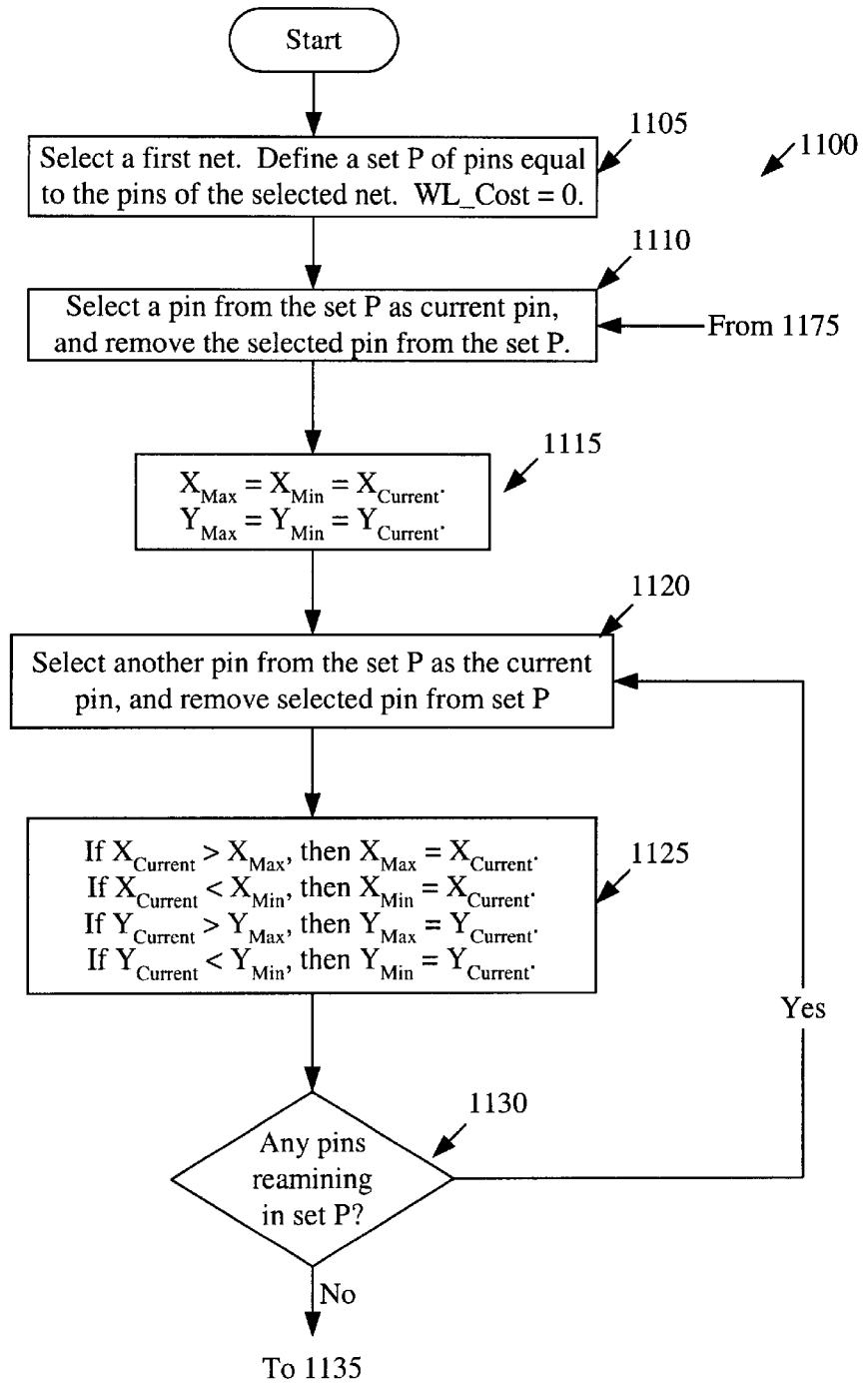
Figure 11B:
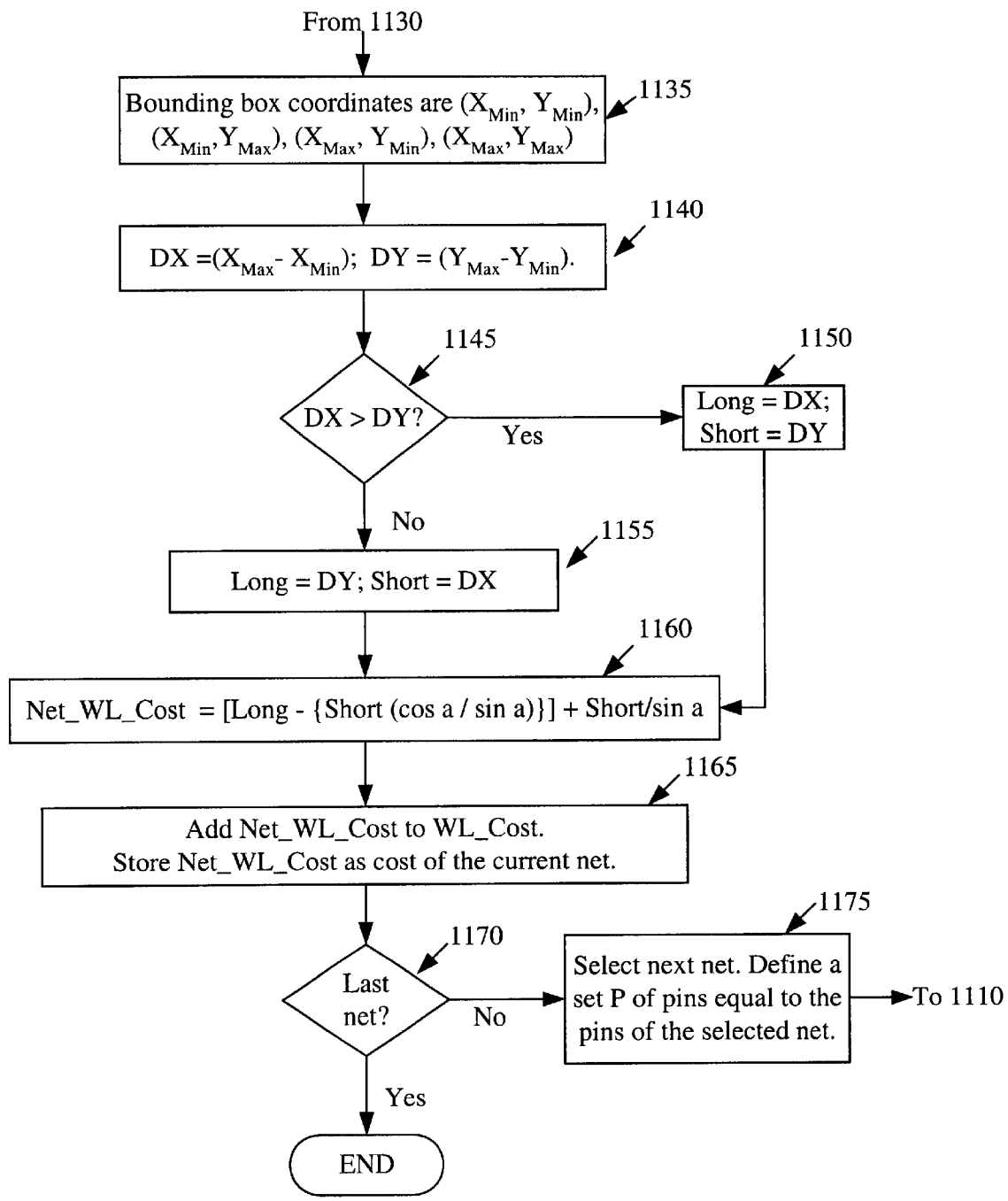

In some embodiments, the computed attribute of a net's bounding box is the minimum distance between opposing corners of the bounding box. FIGS. 10 and 11 illustrate one such embodiment of the invention. FIG. 10 presents an example of a bounding-box 1005 for the net represented by pins 135, 145, and 160 of FIG. 1. Line 1010 traverses the shortest distance between two opposing corners 1035 and 1040 of the box 1005. As shown in FIG. 10, this line is partially diagonal. Specifically, in this example, one segment 1020 of this line is diagonal, while another segment 1015 is horizontal.

Equation (A) below provides the minimum distance between the two opposing corners 1035 and 1040 of the bounding box 1005.

$$\text{Distance} = [L - \{S(\cos A/\sin A)\}] + S/\sin A \quad (A)$$

In this equation, "L" is the box's long side, which in this example is the box's width 1025, while "S" is the box's short side, which in this example is its height 1030. Also, in this equation, "A" is the angle that the diagonal segment 1015 makes with respect to the long side of the bounding box.

In some embodiments, this angle A corresponds to the direction of some of the diagonal interconnect lines in the IC layout. For instance, in some embodiments, the angle A equals 45° when the IC layout uses the octagonal wiring model. In this manner, the diagonal cut 1020 across the bounding box represents a diagonal interconnect line that forms the connection between two opposing corners of the bounding box.

Equations (B)–(D) illustrate how Equation (A) was derived. The length of the line 1010 equals the sum of the lengths of its two segments 1015 and 1020. Equation (B) provides the length of the horizontal segment 1015, while Equation (C) provides the length of the diagonal segment 1020.

$$\text{Length of } 1015 = L - (\text{Length of } 1020)*(\cos A) \quad (B)$$

$$\text{Length of } 1020 = S/\sin A \quad (C)$$

Equations (B) and (C) can be combined to obtain Equation (D) below, which when simplified provides Equation (A) above.

$$\text{Distance} = \text{Length of } 1015 + \text{Length of } 1020 = L - S/\sin A *(\cos A) + S/\sin A \quad (D)$$

When the angle A equals 45°, Equation (A) simplifies to Equation (E) below.

$$\text{Distance } L + S*(\text{sqrt}(2) - 1) \quad (E)$$

If the bounding box has no width or height, then the bounding box is just a line, and the minimum distance between the opposing corners of this line is provided by the long (and only) side of the bounding box, which will be a horizontal or vertical line. Alternatively, when the bounding box is a square and the angle A is 45°, a line that is completely diagonal specifies the shortest distance between the box's two opposing corners.

When the angle A corresponds to the direction of some of the diagonal interconnect lines in the IC layout, the minimum distance computed by Equation (A) corresponds to the shortest length of wiring required to connect two hypothetical net circuit-elements located at opposing corners of the bounding box. In these situations, the distance computed by Equation (A) might not be indicative of the wirelength needed for nets with three or more circuit elements. Moreover, this distance might be shorter than the actual wiring path necessary for even a two-element net, as it may not be possible to route the net along line 1010. The distance value computed by Equation (A) simply provides a lower-bound estimate on the amount of wire required to route a net in a wiring architecture that utilizes horizontal, vertical, and diagonal wiring. Some embodiments also use this equation for other arbitrary wiring models, However, some of these embodiments select the angle A among several choices so that the distance quantified by this equation is minimized.

FIG. 11 illustrates a cost-calculating process 1100 that uses the above-described bounding box method. A placer can use this cost-calculating process to generate a wirelength cost estimate for a set of nets on a net list. In some embodiments, the process 1100 starts whenever it receives a net list that specifies a number of nets.

Each received net has several circuit elements associated with it (i.e., each net is defined to include several circuit elements). In other words, the nets on the net list specify the interconnection between some or all the circuit elements in the IC layout. In the embodiments described below, the circuit elements associated with the nets are the pins of the circuit modules in the IC layout. Other embodiments, however, treat the circuit modules as the circuit elements of the nets. Some of these embodiments treat the circuit modules as the net circuit elements and obviate the need to distinguish between the different pin locations, by assuming that the pins of each module are all located at uniform locations (e.g., located at the origin of the modules).

In some embodiments, the positions of the net circuit elements before the process 1100 starts define an initial placement configuration. In some of these embodiments, the initial circuit-element positions are random. In other embodiments, a previous physical-design operation, such as the floor planning, partially or completely specifies the initial positions of these elements. Other embodiments use another placer to specify the initial positions of the circuit elements, and then use process 1100 to optimize the placement configuration for a wiring architecture that uses diagonal wiring.

The process 1100 initially (at 1105) sets the wirelength cost estimate (WL_Cost) to zero, and selects a first net from the received net list. Each net has a set N of pins. At 1105, the process also defines a set P of pins equal to the set N of pins of the selected net. At 1110, the process selects a pin from the defined set P of pins, and removes this selected pin from the set P. The process then uses (at 1115) the x-and y-coordinates of the selected pin to initialize the maximum and minimum x- and y-coordinates of a bounding box for the current net.

Next, the process selects (at 1120) another pin from the set P of pins for the current net. At 1125, the process examines the x- and y-coordinates of the pin selected at 1120 (i.e., the current pin) to determine whether it needs to modify the maximum and minimum x- and y-coordinates of the bounding box for the current net. Specifically, if the maximum x-coordinate ($X_{MAX}$) of the bounding box is less than the x-coordinate of the current pin, the process sets the maximum x-coordinate ($X_{MAX}$) of the bounding box equal to the x-coordinate of the current pin. Alternately, if the minimum x-coordinate ($X_{MIN}$) of the bounding box is greater than the x-coordinate of the current pin, the process sets the minimum x-coordinate ($X_{MIN}$) of the bounding box equal to the x-coordinate of the current pin. Similarly, if the minimum y-coordinate ($Y_{MIN}$) of the bounding box is greater than the y-coordinate of the current pin, the process sets the minimum y-coordinate ($Y_{MIN}$) of the bounding box equal to the y-coordinate of the current pin. On the other hand, if the maximum y-coordinate ($Y_{MAX}$) of the bounding box is less than the y-coordinate of the current pin, the process sets the maximum y-coordinate ($Y_{MAX}$) of the bounding box equal to the y-coordinate of the current pin.

After 1125, the process determines (at 1130) whether there are any pins in set P (i.e., whether there are any pins in the current net that it has not yet examined). If so, the process transitions back to select (at 1120) another pin, and to determine (at 1125) whether it needs to use the selected pin's coordinates to modify the x- and y-coordinates of the bounding box. If the process determines (at 1130) that it has examined all the pins of the current net, the process defines (at 1135) the four coordinates of the current net's bounding box as ($X_{MIN}$, $Y_{MIN}$), ($X_{MIN}$, $Y_{MAX}$), ($X_{MAX}$, $Y_{MIN}$), and ($X_{MAX}$, $Y_{MAX}$).

Next, the process determines (at 1140) the bounding-box's width and height. The process determines (1) the width by taken the difference between the maximum and minimum x-coordinates of the bounding box, and (2) the height by taking the difference between the maximum and minimum y-coordinates of the bounding box. The process then determines (at 1145) whether the computed width is greater than the computed height. If so, the process defines (1150) the width as the long side and the height as the short side. Otherwise, the process defines (at 1155) the width as the short side and the height as the long side.

The process then computes (at 1160) a wirelength cost estimate (Net_WL_Cost) for the current net, by computing the distance between two opposing corners of the bounding box by using the above-described Equation (A). The process next (at 1165) (1) adds the computed net wirelength cost (Net_WL_Cost) to the total wirelength cost (WL_Cost), and (2) stores the net wirelength cost (Net_WL_Cost). At 1170, the process determines whether it has examined all the nets in the net list. If not, at 1175, it selects another net from the net list, and defines a set P of pins equal to the set N of pin of this selected net. The process then transitions back to 1110 to compute the bounding-box cost for this selected net.

When the process has calculated the bounding-box cost for all the nets, the process determines (at 1170) that it has examined all the nets in the net list. At this point, the process returns the value of the wirelength cost variable (WL_Cost) as the estimated wirelength cost for the received net list, and then ends.

In some embodiments of the invention, the process 1100 generates a wirelength cost estimate (WL_Cost) for an initial placement configuration, when it receives a net list that specifies the initial placement configuration (i.e., a net list that identifies all the nets in the IC layout before any modifications to the positions of the modules in the layout).

After obtaining the wirelength cost of the initial placement configuration, some embodiments use an optimization process that iteratively modifies the placement configuration to improve the placement-configuration cost. In some embodiments, the optimization process uses the process 1100 to calculate the placement-configuration cost for each possible iterative modification to the placement configuration. This is further described below in Section V, which presents several suitable optimization techniques.

III. Connection Graphs with Potential Diagonal Lines

Some embodiments of the invention construct connection graphs that model potential interconnect (i.e., wiring) topologies, in order to estimate the wirelength cost of different placement configurations. Generally, a connection graph for a net models (1) each net element (i.e., pin or module) as a node (also called a vertex or point), and (2) each potential interconnect line that connects two net elements as an edge (also called a line).

The connection graphs of the invention can include edges that are completely or partially diagonal. Such connection graphs include minimum spanning trees ("MST") and Steiner trees, which are described below. One of ordinary skill will understand that other embodiments of the invention use other connection graphs (such as complete graphs, minimum chain graphs, source-to-sink graphs, etc.) to model the potential interconnect topologies.

A. Minimum Spanning Trees.

Some embodiments generate wirelength cost estimate for placement configurations by (1) constructing, for each net, a MST that can have diagonal edges, (2) computing the length of each MST, and (3) summing the computed lengths. A minimum spanning tree for a net is a tree that connects (i.e., spans) the net's elements through the shortest route that only branches at the elements. The length of a minimum spanning tree provides a lower-bound estimate of the amount of wire needed to interconnect the net's elements (i.e., the net's pins or modules).

More specifically, a spanning tree for an N-element net includes (1) N nodes corresponding to the N elements, and (2) N−1 edges that connect its N nodes. The edges of a minimum spanning tree can only start and end at one of the N nodes of the tree. Also, in a MST, the edges are typically selected to provide the shortest achievable route to connect its nodes.

In some embodiments of the invention, the edges of the MST's can be horizontal, vertical, or diagonal. The diagonal edges can be completely or partially diagonal. Also, when the IC layouts use diagonal interconnect lines (e.g., ±120° interconnect lines), the diagonal edges of the MST's can be in the same direction (e.g., can be in ±120° directions) as some of the diagonal interconnect lines in the layout.

Figure 12:
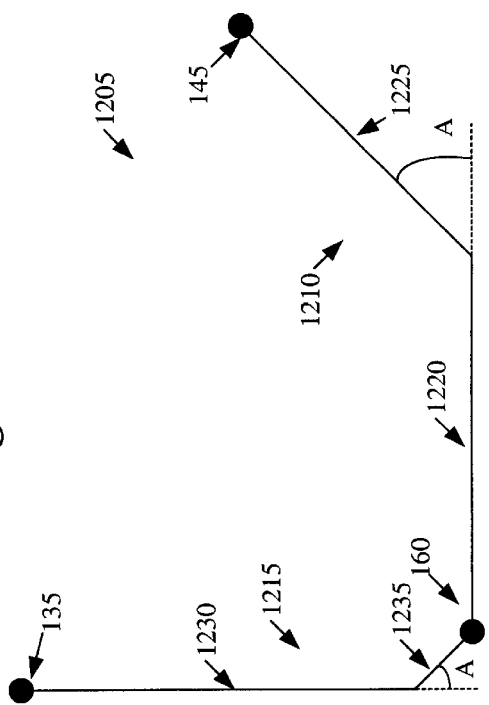
FIG. 12 presents a minimum spanning tree with diagonal edges.

For instance, when the IC layout uses an octagonal wiring model (i.e., uses horizontal, vertical, and 45° diagonal lines), some embodiments construct MST's that have horizontal, vertical, and 45° diagonal edges. FIG. 12 illustrates an example of such a MST. This tree 1205 is the MST of the net that contains pins 135, 145, and 160 of FIG. 1. This tree has two edges 1210 and 1215, with the first edge 1210 having a horizontal segment 1220 and a +45° diagonal segment 1225, while the second edge 1215 has a vertical segment 1230 and a −45° diagonal segment 1235.

By treating the two nodes of each MST edge as two opposing corners of a box, the length of each MST edge can be obtained by using the above-described Equation (A).

$$\text{Distance} = [L - \{S(\cos A / \sin A)\}] + S / \sin A \quad \text{(A)}$$

As described above, in this equation, "L" is the box's long side, "S" is the box's short side, and "A" is the angle that the diagonal segment of the edge makes with respect to the long side of the bounding box.

Figure 13B:
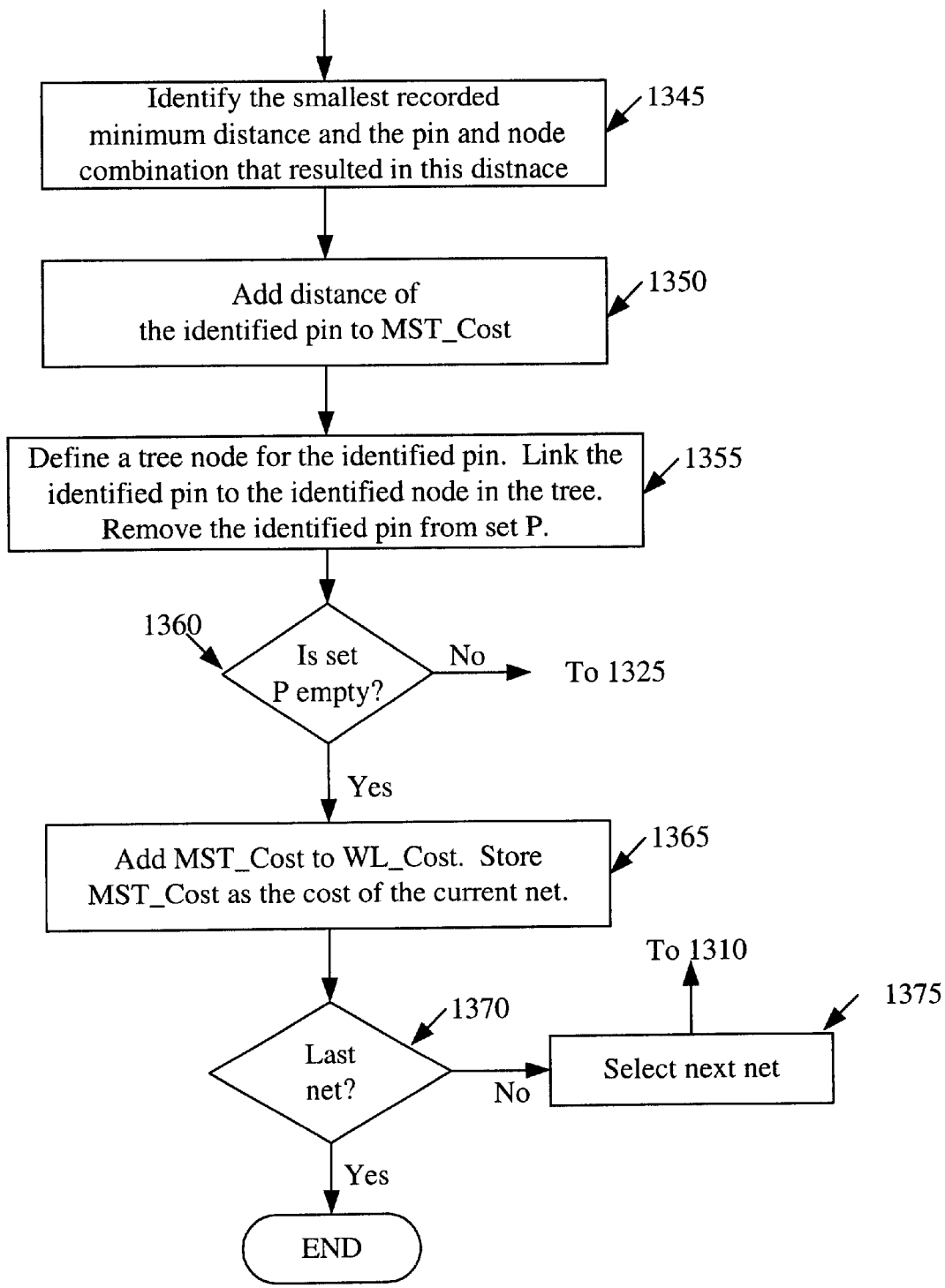

FIG. 13 illustrates a cost-calculating process 1300 that computes the length of MST's that model the interconnect topologies of several nets. A placer can use this process to generate a wirelength cost estimate for a set of nets on a net list. In some embodiments, the process 1300 starts whenever it receives a net list that specifies a number of nets.

Each received net has several circuit elements associated with it (i.e., each net is defined to include several circuit elements). In other words, the nets on the net list specify the interconnection between some or all the circuit elements in the IC layout. In the embodiments described below, the circuit elements associated with the nets are the pins of the circuit modules in the IC layout. Other embodiments, however, treat the circuit modules as the circuit elements of the nets. Some of these embodiments treat the circuit modules as the net circuit elements and obviate the need to distinguish between the different pin locations, by assuming that the pins of each module are all located at uniform locations (e.g., located at the origin of the modules).

In some embodiments, the positions of the net circuit elements before the process 1300 starts define an initial placement configuration. In some of these embodiments, the initial circuit-element positions are random. In other embodiments, a previous physical-design operation, such as the floor planning, partially or completely specifies the initial positions of these elements. Other embodiments use another placer to specify the initial positions of the circuit elements, and then use process 1300 to optimize the placement configuration for a wiring architecture that uses diagonal wiring.

The process 1300 initially (at 1305) sets the wirelength cost estimate (WL_Cost) to zero, and selects a first net from the received net list. Next, the process defines (at 1310) a set P of pins equal to the selected net's set of pins. The process then (at 1315) sets the minimum-spanning-tree cost (MST_Cost) of the selected net to zero.

Next, the process (at 1320) (1) selects a pin from the retrieved set of pins as the first node of the spanning tree, and (2) removes this pin from this set. The process then defines (at 1325) a remainder set R of pins equal to the current set P of pins. At 1330, the process selects a pin from the remaining pin set R, and removes the selected pin from this pin set.

The process then computes and stores (at 1335) the distance between the pin selected at 1330 and each current node of the spanning tree. The distance between the selected pin and each node can be traversed by an edge that is completely or partially diagonal. Hence, the process uses (at 1335) Equation (A) to compute the minimum distance between the selected pin and each node.

The process next determines (at 1340) whether there is any pin remaining in set R. If so, the process returns to 1330 to select another pin from this set, so that it can compute at 1335 the distance between this pin and the current nodes of the spanning tree. Otherwise, the process (at 1345) identifies the smallest distance recorded at 1335, and identifies the pin and node combination that resulted in this distance. The process then adds (at 1350) the identified smallest distance to the minimum-spanning-tree cost (MST_Cost). The process also (at 1355) (1) defines a tree node corresponding to the pin identified at 1345, (2) removes the identified pin from the pin set P, and (3) links the defined tree node to the node identified at 1345.

The process then determines (at 1360) whether the pin set P is empty. If not, the process transitions back to 1325 to identify the next pin that is closest to the current nodes of the tree. Otherwise, the process (at 1365) (1) adds the minimum-spanning-tree cost (MST_Cost) of the current net to the wirelength cost (WL_Cost), and (2) stores the current net's minimum-spanning-tree cost (MST_Cost). The process then determines (at 1370) whether it has constructed the minimum spanning tree of all the received nets. If not, the process selects (at 1375) another net, and transitions back to 1310 to construct the minimum spanning tree for this net.

Otherwise, if the process determines that it has constructed the MST of all the nets, the process returns the value of the wirelength cost variable (WL_Cost) as the estimated wirelength cost of the current placement configuration. The process then ends.

In some embodiments of the invention, the process 1300 generates a wirelength cost estimate (WL_Cost) for an initial placement configuration, when it receives a net list that specifies the initial placement configuration (i.e., a net list that identifies all the nets in the IC layout before any modifications to the positions of the modules in the layout).

After obtaining the wirelength cost of the initial placement configuration, some embodiments use an optimization process that iteratively modifies the placement configuration to improve the placement-configuration cost. In some embodiments, the optimization process uses the process 1300 to calculate the placement-configuration cost for each possible iterative modification to the placement configuration. This is further described below in Section VI, which presents several suitable optimization techniques.

B. Steiner Tree with Diagonal Edges.

Some embodiments generate wirelength cost estimate for placement configurations by (1) constructing, for each net, a Steiner tree that can have diagonal edges, (2) computing the length of each Steiner tree, and (3) summing the computed lengths. Steiner trees are similar to minimum spanning trees except that Steiner trees do not restrict branching to only the locations of the elements of the nets. In some embodiments, Steiner trees can have edges that branch off (i.e., start or terminate) from points in the middle of other edges.

In some embodiments of the invention, the edges of the Steiner tree can be horizontal, vertical, or diagonal. The diagonal edges can be completely or partially diagonal. Also, when the IC layouts use diagonal interconnect lines (e.g., ±120° interconnect lines), the diagonal edges can be in the same direction (e.g., can be in ±120° directions) as some of the diagonal interconnect lines in the layout.

Figure 14:
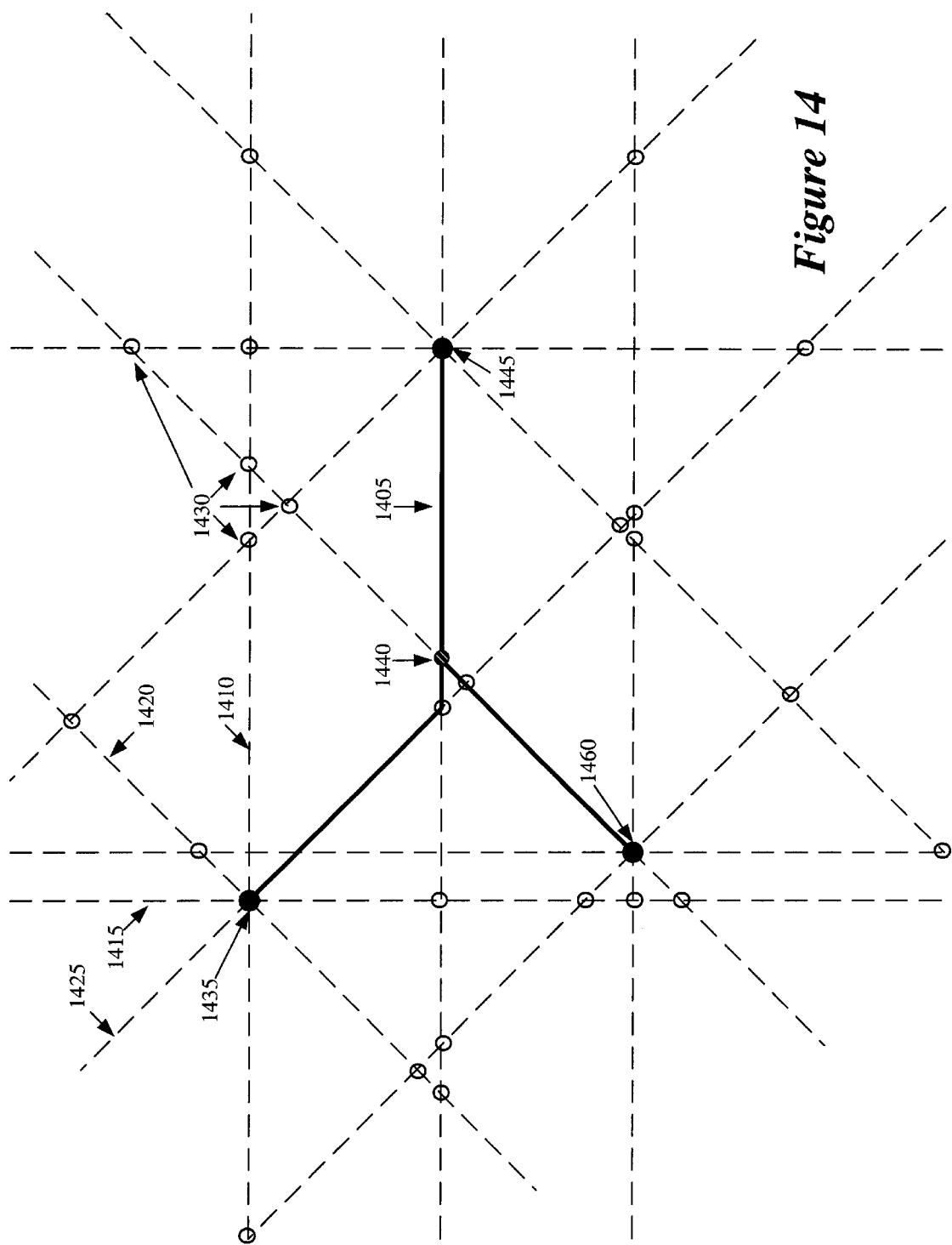
FIG. 14 illustrates a heuristically constructed Steiner tree with 45° edges for the net represented by pins 135, 145, and 160 of FIG. 1.

To construct a Steiner tree for an N-element net, additional points, called Steiner points, can be added to the net. Heuristic techniques are often used to select the Steiner points. FIG. 14 illustrates one heuristic technique that is used in some embodiments of the invention, for IC layouts that use the octagonal wiring model (i.e., that use horizontal, vertical, and 45° interconnect lines). This figure presents a Steiner tree 1405 for the net that contains pins 135, 145, and 160 of FIG. 1. In this example, the Steiner tree 1405 includes three original nodes 1435, 1445, and 1460 corresponding to the pins 135, 145, and 160.

Also, in this example, a set of potential Steiner points are identified by passing four lines through each original node of the Steiner tree. Of these four lines, one 1410 is horizontal, one 1415 is vertical, one 1420 is a +45° diagonal line, and one 1425 is a −45° diagonal line. As shown in FIG. 14, the intersection of the lines that pass through each original node defines a set of potential Steiner points 1430. A few of these potential points can then be added as nodes in the Steiner tree, in order to minimize the length of the tree. In FIG. 14, the Steiner point 1440 has been added as nodes in the tree.

Figure 15B:
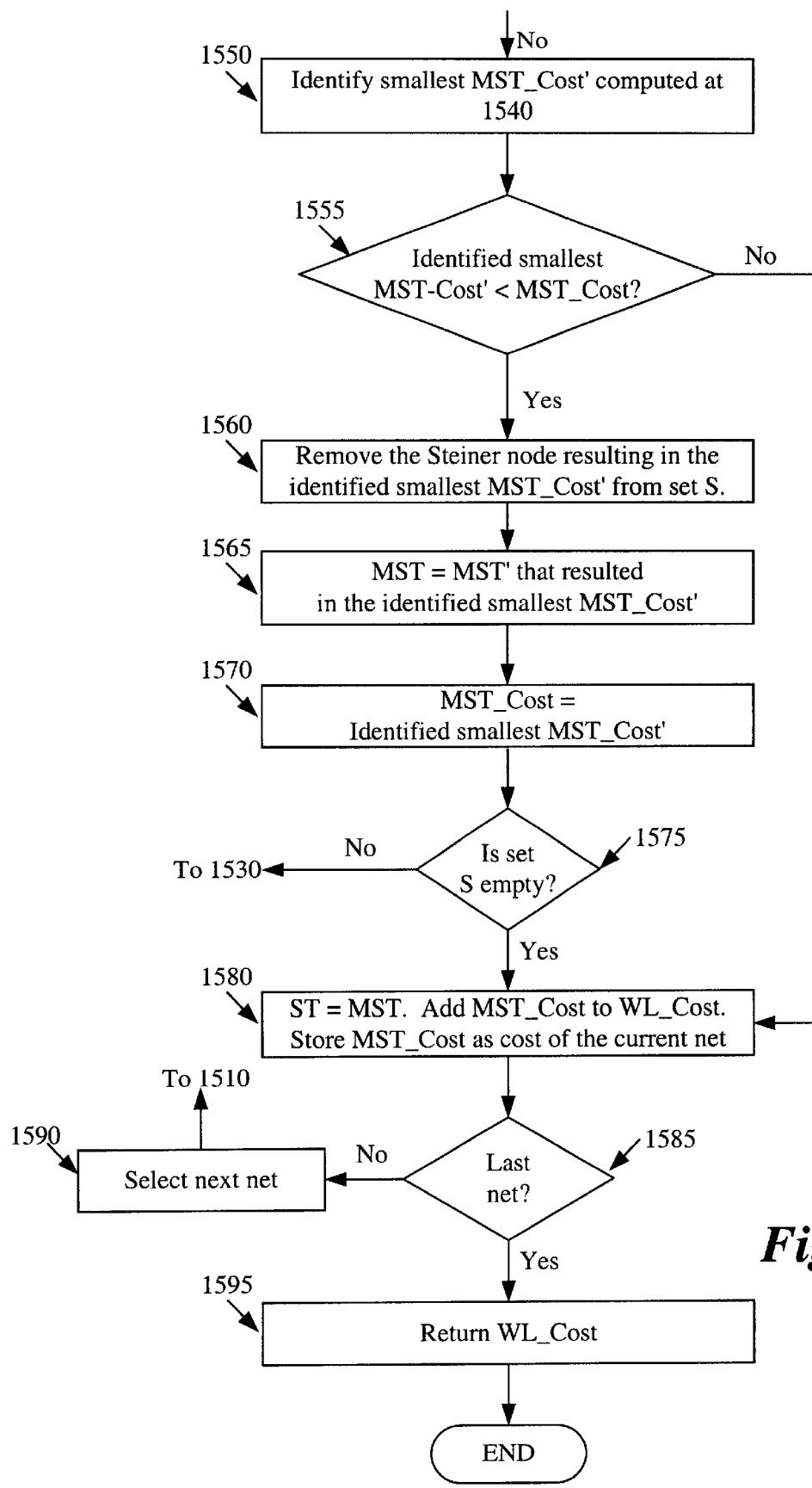

FIG. 15 illustrates a cost-calculating process 1500 that computes the length of Steiner trees that model the interconnect topologies of several nets. A placer can use this process to generate a wirelength cost estimate for a set of nets on a net list. In some embodiments, the process 1500 starts whenever it receives a net list that specifies a number of nets.

Each received net has several circuit elements associated with it (i.e., each net is defined to include several circuit elements). In other words, the nets on the net list specify the interconnection between some or all the circuit elements in the IC layout. In the embodiments described below, the circuit elements associated with the nets are the pins of the circuit modules in the IC layout. Other embodiments, however, treat the circuit modules as the circuit elements of the nets. Some of these embodiments treat the circuit modules as the net circuit elements and obviate the need to distinguish between the different pin locations, by assuming that the pins of each module are all located at uniform locations (e.g., located at the origin of the modules).

In some embodiments, the positions of the net circuit elements before the process 1500 starts define an initial placement configuration. In some of these embodiments, the initial circuit-element positions are random. In other embodiments, a previous physical-design operation, such as the floor planning, partially or completely specifies the initial positions of these elements. Other embodiments use another placer to specify the initial positions of the circuit elements, and then use process 1500 to optimize the placement configuration for a wiring architecture that uses diagonal wiring.

The process 1500 is a modification of the One-Steiner process. Like the traditional One-Steiner process, this process 1500 constructs a heuristic Steiner tree by adding Steiner nodes that minimize the MST of the original and added pin nodes. However, unlike the traditional One-Steiner process, this modified process allows the edges of the heuristic Steiner tree to be partially or completely diagonal.

This process initially (at 1505) sets the wirelength cost estimate (WL_Cost) to zero, and selects a first net from the received net list. Next, the process defines (at 1510) a set P of pins equal to the selected net's set of pins. The process then (at 1515) sets the wirelength cost (WL_Cost) of the selected net to zero. After 1515, the process constructs (at 1520) the minimum spanning tree of the selected net, and computes the cost (MST_Cost) of this tree. This minimum spanning tree can have edges that are completely or partially diagonal. The process can construct the MST by performing the operations 1310 to 1360 of FIG. 13.

After constructing the MST for the selected net, the process identifies (at 1525) a set S of candidate Steiner points. As described above by reference to FIG. 14, the process can identify these points by passing a pair of diagonal lines and a pair of Manhattan lines through each pin in the net and identifying the intersection of these lines. When the IC layouts use diagonal interconnect lines (e.g., ±120° interconnect lines), the diagonal lines passed through each pin can be in the same direction (e.g., can be in ±120° directions) as some of the diagonal interconnect lines in the layout.

Next, the process defines (at 1530) a remainder set R of nodes equal to the current set S of potential Steiner points. At 1535, the process selects a node from the remaining node set R, and removes the selected node from this set. The process then (at 1540) (1) constructs a minimum spanning tree (MST') for the node selected at 1535 and the nodes of the current MST for the selected net, and (2) computes and stores the cost (MST_Cost') of this minimum spanning tree (MST'). The process constructs this minimum spanning tree (MST') by using edges that are completely or partially diagonal. Also, the process can construct this tree MST' by performing the operations 1310 to 1360 of FIG. 13.

Next, the process determines (at 1545) whether there is any node remaining in set R. If so, the process returns to 1535 to select another node from this set, so that it can construct a minimal spanning tree for this other node and the nodes of the current MST.

Otherwise, the process (at 1550) identifies the smallest minimum-spanning-tree cost (MST_Cost') computed at 1540. The process then determines (at 1555) whether the identified smallest minimum-spanning-tree cost (MST_Cost') is less than the cost (MST_Cost) of the current minimum spanning tree (MST) created at 1520. If not, the process transitions to 1580, which will be described below. Otherwise, from the set S of potential Steiner nodes, the process removes (at 1560) the Steiner node that resulted in the smallest minimum-spanning-tree cost (MST_Cost') identified at 1550. The process then identifies (at 1565) the minimum spanning tree (MST') that resulted in the identified smallest minimum-spanning-tree cost (MST_Cost') as the current minimum spanning tree (MST). The process also sets (at 1570) the minimum-spanning-tree cost (MST_Cost) equal to the identified smallest minimum-spanning-tree cost (MST_Cost').

The process next determines (at 1575) whether the set S of candidate Steiner points is empty. If not, the process returns to 1530 to see if it can find another potential Steiner point that would further reduce the length of the current minimum spanning tree (MST).

If the process 1500 determines (at 1575) that all the candidate Steiner points have been examined and set S is empty, it (at 1580) (1) defines the Steiner tree as the current MST, (2) adds this MST's cost (MST_Cost) to the estimated wirelength cost (WL_Cost), and (2) stores this MST's cost (MST_Cost) as the cost of the current net. After 1580, the process determines (at 1585) whether it has constructed Steiner trees for all the nets in the received net list. If not, the process selects (at 1590) another net and returns to 1510 to construct a Steiner tree for this net. Otherwise, the process returns (at 1595) the wirelength cost (WL_Cost) of the current placement configuration, and then ends.

In some embodiments of the invention, the process 1500 generates a wirelength cost estimate (WL_Cost) for an initial placement configuration, when it receives a net list that specifies the initial placement configuration (i.e., a net list that identifies all the nets in the IC layout before any modifications to the positions of the modules in the layout).

After obtaining the wirelength cost of the initial placement configuration, some embodiments use an optimization process that iteratively modifies the placement configuration to improve the placement-configuration cost. In some embodiments, the optimization process uses the process 1500 to calculate the placement-configuration cost for each possible iterative modification to the placement configuration. This is further described below in Section VI, which presents several suitable optimization techniques.

IV. Min-Cut Bipartitioning with Diagonal Lines

Some embodiments of the invention are min-cut bipartitioning techniques that utilize diagonal cut lines. As further described below by reference to FIGS. 16–18, some embodiments only utilize diagonal cut lines, while other embodiments use diagonal, horizontal, and vertical cut lines.

The cut lines are used to partition the IC layout recursively into successive pairs of regions. After defining the cut line at each level of the recursion, the invention's min-cut bipartitioning method calculates the number of nets that are intersected by the cut line of the particular level. This number is indicative of the wire congestion about this cut line. Next, at each recursion level, an optimization technique is used to move the circuit modules between the regions at that level, in order to reduce the number of nets intersected by the cut line of that level. The minimization of the net-cut cost at each level of the recursion reduces wire congestion across the cut line at that level.

The invention's min-cut bipartitioning technique can be used with IC layouts that only use the Manhattan wiring model (i.e., IC layouts that only have preferred horizontal and vertical direction wiring). In other instances, the invention's min-cut bipartitioning technique is used with IC layouts that have diagonal interconnect lines. In some of these instances, the diagonal cut lines are in the same direction as some or all of the diagonal interconnect lines.

For instance, for IC layouts that use the octagonal wiring model (i.e., that use horizontal, vertical, and 45° diagonal lines), some embodiments use 45° diagonal cut lines.

Figure 16:
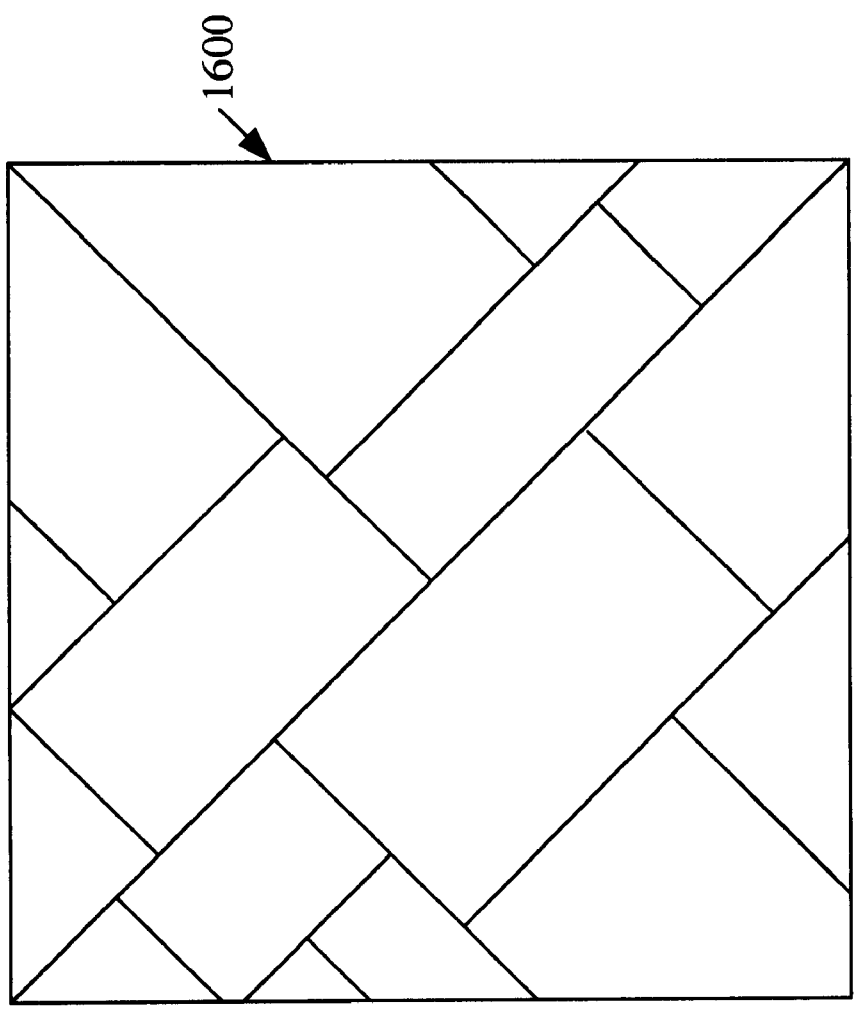
FIG. 16 illustrates an IC layout that has been recursively partitioned into a number of regions by only diagonal cut lines.

FIG. 16 illustrates an IC layout 1600 that has been recursively partitioned into a number of regions by only diagonal cut lines. Such a strict diagonal-partitioning approach is typically used when the IC layout uses only diagonal interconnect lines. However, such an approach can be taken when the IC layout uses diagonal and Manhattan interconnect lines.

Figure 18:
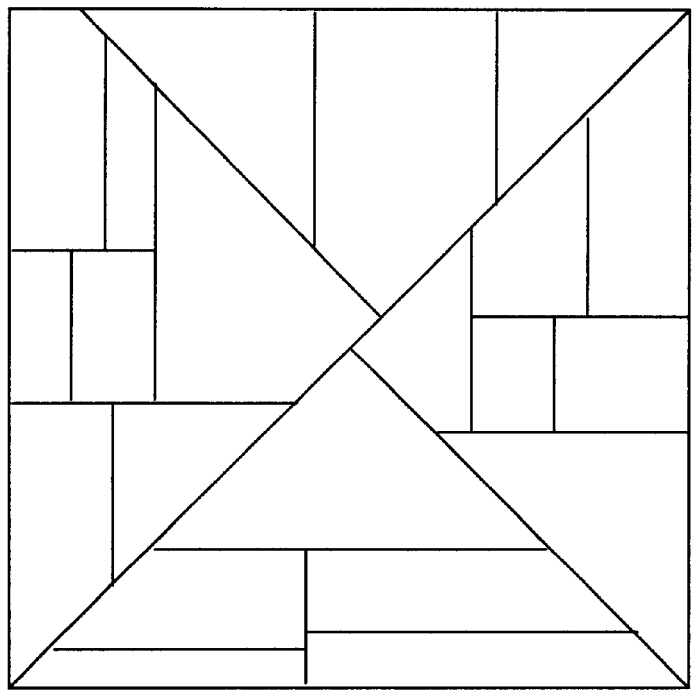
FIGS. 17 and 18 illustrate two IC layouts that are recursively partitioned by combinations of diagonal, horizontal, and vertical cut lines.
Figure 17:
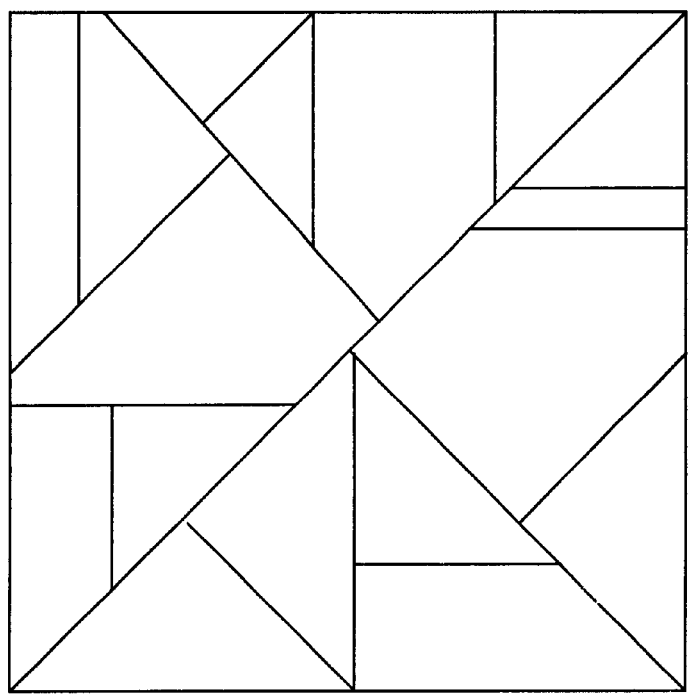

FIGS. 17 and 18 illustrate two IC layouts that are recursively partitioned by combinations of diagonal, horizontal, and vertical cut lines. In FIG. 17, diagonal cut lines are used at all levels of the recursion. On the other hand, in FIG. 18, the diagonal cut lines are only used at the higher recursion levels, and Manhattan cut lines are used at the lower levels of the recursion.

In other words, the partitioning scheme illustrated in FIG. 18 stops using diagonal cut lines once it reaches some of the lower levels of the recursion process. Such a partitioning scheme (i.e., a scheme that stops using diagonal cut lines at the lower recursion levels) is useful in connection with IC layouts that have their diagonal layers as their top metal layers. Such a partitioning scheme is useful for such layouts because the first set of cut lines reduce the congestion of longer wires, and the longer wires are likely to be diagonal wires. In octagonal wiring models that have the diagonal layers as the top metal layers, the diagonal wires tend to be long, because otherwise it would be wasteful to incur the delay costs associated with the vias necessary for performing the routing on the higher layers.

Figure 19:
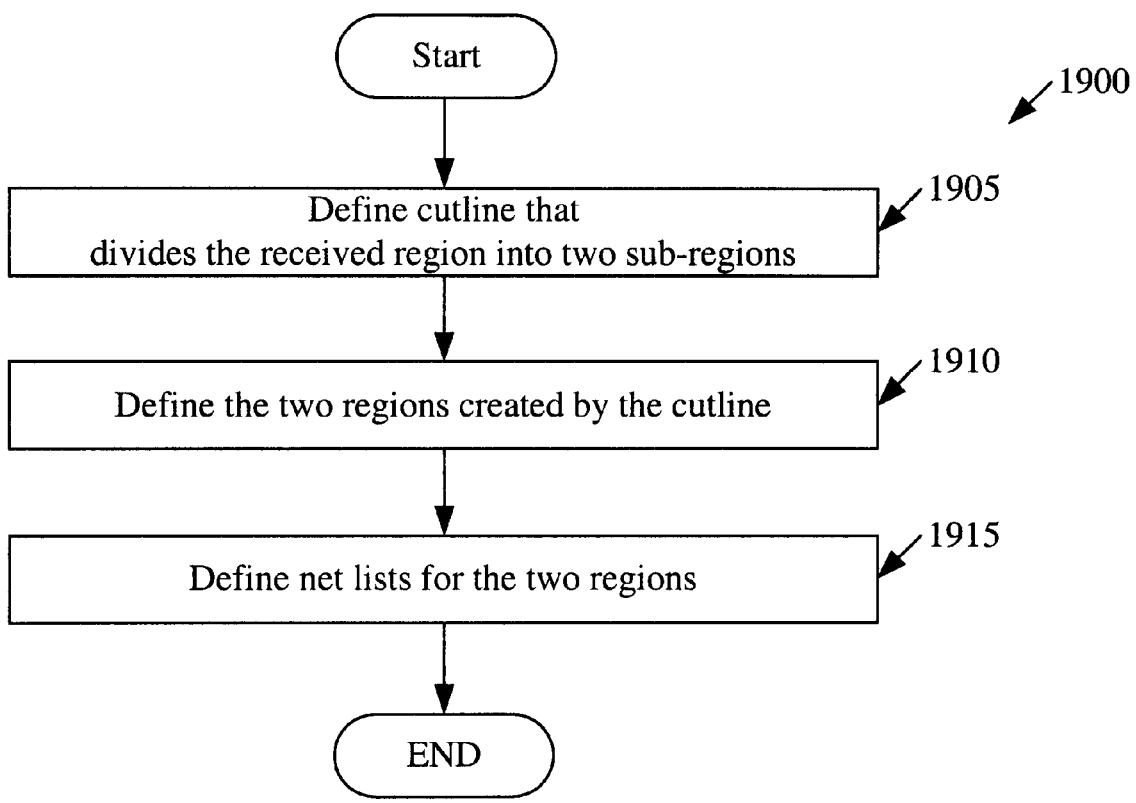
FIG. 19 is a process that defines a cut line that partitions a layout region into two smaller regions.
Figure 20A:
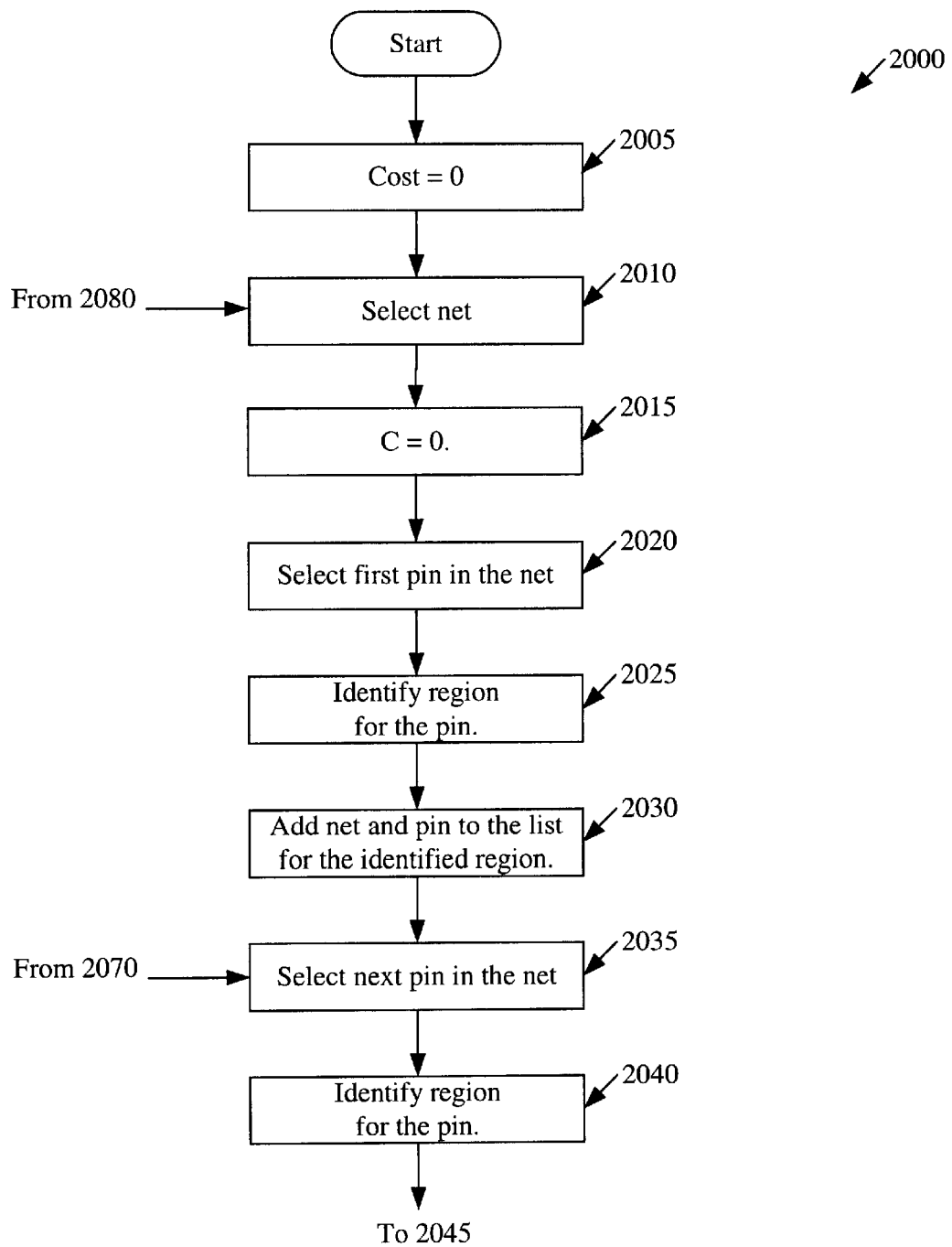
Figure 20B:
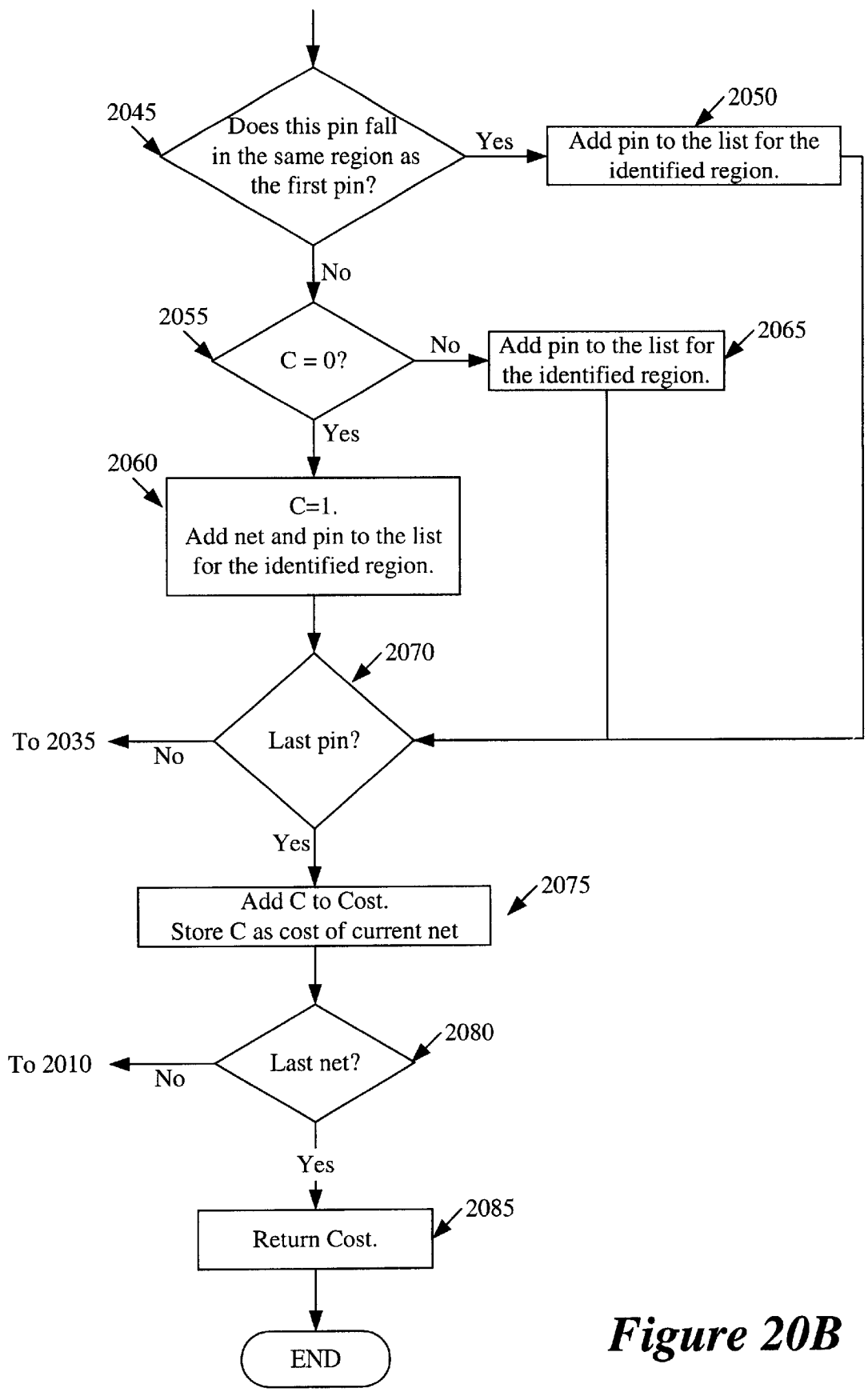

FIGS. 19 and 20 illustrate two processes 1900 and 2000 that a placer can use to perform min-cut bipartitioning with diagonal cut lines. The placer can repeatedly use these processes 1900 and 2000 to minimize congestion across the IC layout. Specifically, the placer can repeatedly perform the process 1900 of FIG. 19 to define a series of cut lines that recursively partition the IC layout into smaller and smaller regions. After defining the cut line at a particular level of the recursion, the placer can then use the process 2000 of FIG. 20 to obtain congestion cost estimates, and to partition nets, across the cut line of that level.

The process 1900 starts whenever it receives the coordinates of a region of the IC layout. As shown in FIG. 19, this process initially defines (at 1905) a horizontal, vertical, or diagonal cut line that divides the received region into two sub-regions. After defining the cut line, the process 1900 defines (at 1910) two regions created by the cut line. Some embodiments use the following convention to define the regions: (1) when the cut line is horizontal or diagonal, the first region is above the cut line, while the second region is below the cut line, and (2) when the cut line is vertical, the first region is to the right of the cut line, and the second region is to the left of the cut line.

Finally, the process 1900 initializes two net lists for the two regions created by the cut line defined at 1905. As further described below, the first time the process 2000 is performed for all the nets in the received region, the process 2000 adds the nets in this received region and the pins of these net to these two net lists. Also, as further described below, the placer and the process 2000 might remove and add nets and pins to these two net lists during the optimization process.

FIG. 20 illustrates a process 2000 that a placer can use to partition a set of nets, and to calculate the congestion cost of these nets, about a cut line that can be diagonal. The process 2000 starts whenever it receives (1) a list of nets, and (2) a cut line for partitioning the nets.

Each net on the received net list has several circuit elements associated with it (i.e., each net is defined to include several circuit elements), In other words, the nets on the net list specify the interconnection between some or all the circuit elements in the IC layout. In the embodiments described below, the circuit elements associated with the nets are the pins of the circuit modules in the IC layout. Other embodiments, however, treat the circuit modules as the circuit elements of the nets. Some of these embodiments treat the circuit modules as the net circuit elements and obviate the need to distinguish between the different pin locations, by assuming that the pins of each module are all located at uniform locations (e.g., located at the origin of the modules).

In some embodiments, an initial placement configuration is defined by the positions of the net circuit elements before the process 2000 is performed for the first cut line. In some of these embodiments, the initial placement configuration is random. In other embodiments, a previous physical-design operation, such as the floor planning, partially or completely specifies the initial placement configuration. Other embodiments use another placer to specify the initial placement configuration, and then use processes 1900 and 2000 to optimize the placement configuration for a wiring architecture that uses diagonal wiring.

As shown in FIG. 20, the process 2000 initially sets (at 2005) the congestion cost (Cost) equal to 0. The process then selects (at 2010) a net from the received net list. It then sets (at 2015) a net-cut variable (C) to 0. The process next selects (at 2020) a first pin of the selected net. After selecting the pin, the process determines (at 2025) which of the two regions defined by the cut line contains the pin. The process 2000 identifies the region for the pin by using one of three processes, which are illustrated in FIGS. 21, 22, and 23.

Figure 21:
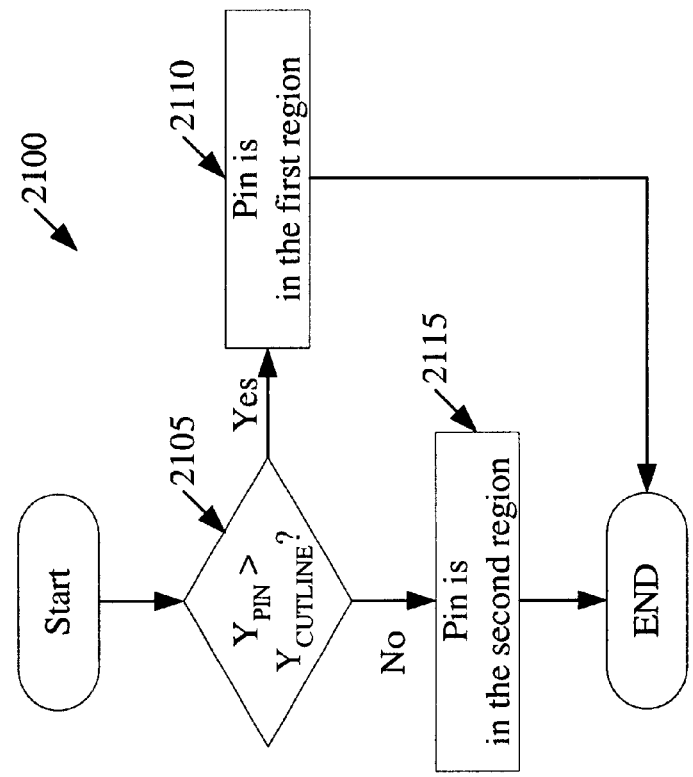

The process 2000 calls the process 2100 of FIG. 21 when the cut line is horizontal. As shown in FIG. 21, the process 2100 determines (at 2105) whether the y-coordinate of the pin is greater than the y-coordinate of the horizontal cut line. If so, the process specifies (at 2110) that the pin is in the first region defined by the cut line. Otherwise, the process specifies (at 2115) that the pin is in the second region defined the. cut line.

Figure 22:
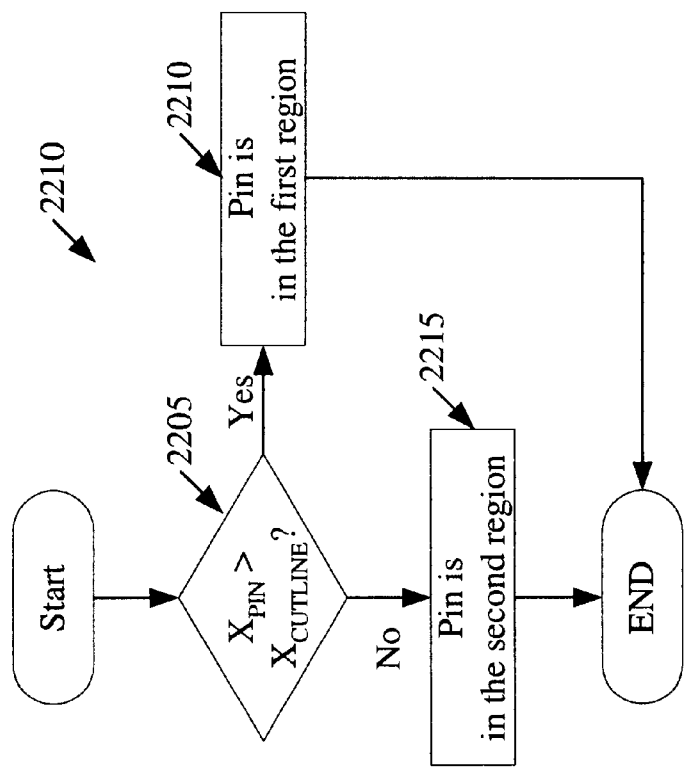
FIGS. 21, 22, and 23 illustrate three processes for identifying a region for a pin.

The process 2000 uses the process 2200 of FIG. 22 when the cut line is vertical. As shown in FIG. 22, the process 2200 determines (at 2205) whether the x-coordinate of the pin is greater than the x-coordinate of the vertical cut line. If so, the process specifies (at 2210) that the pin is in the first region defined by the cut line. Otherwise, the process specifies (at 2215) that the pin is in the second region defined the cut line.

Figure 23:
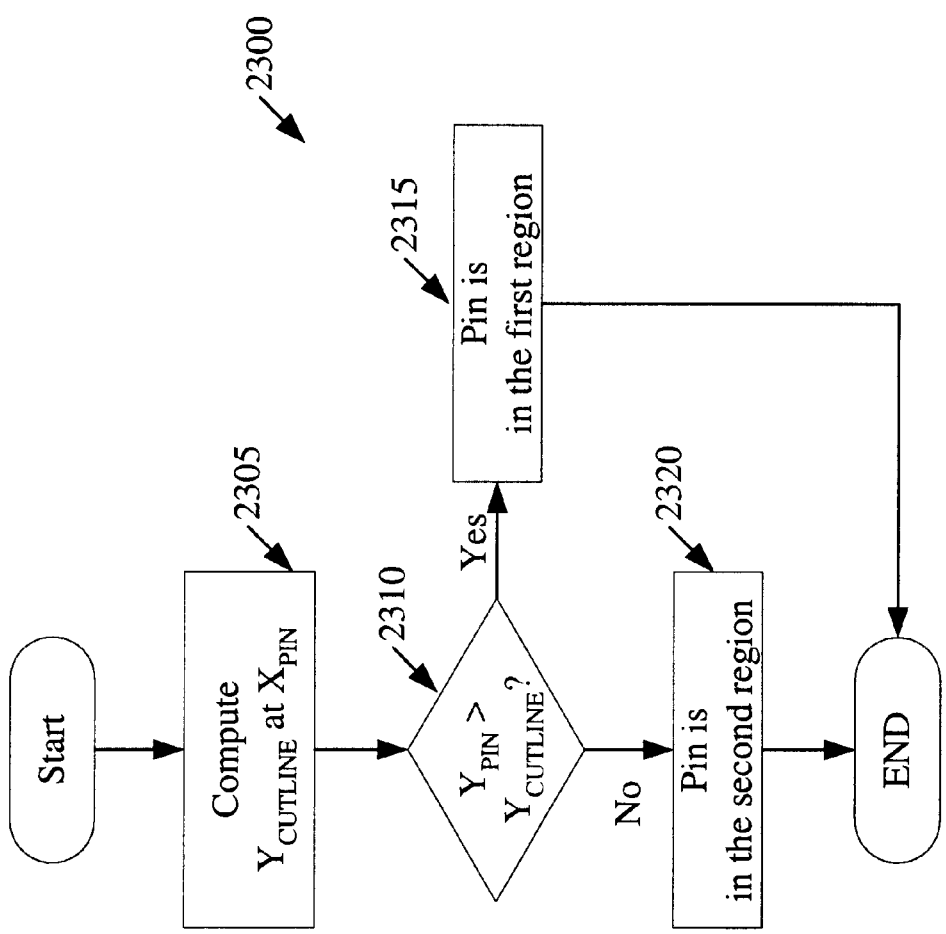

The process 2000 calls the process 2300 of FIG. 23 when the cut line is diagonal. As shown in FIG. 23, the process 2300 inserts (at 2305) the x-coordinate of the pin in the linear equation (y=mx+b) that represents the cut line. This equation expresses the y-coordinate value of the cut line in terms of its slope (m), x-coordinate, and y-intersect (b). The process then determines (2310) whether the derived y-value of the diagonal line at the inserted x-location is greater than the y-coordinate of the pin. If not, the process specifies (at 2315) that the pin is in the first region defined by the cut line. Otherwise, the process specifies (at 2320) that the pin is in the second region defined the cut line.

After identifying the region for the pin, the process adds (at 2030) the selected net and pin to the net list for the identified region. The process then selects (at 2035) the next pin in the net. At 2040, the process identifies the region for the pin selected at 2035 by calling the same processes described above for 2025.

The process then determines (at 2045) whether the current pin (i.e., the pin selected at 2035) falls in the same region as the first pin. If so, the process adds the current pin to the net previously added (at 2030) to the net list for the identified region. The process then transitions to 2070, which will be described below.

On the other hand, if the process determines (at 2045) that the current pin does not fall in the same region as the first pin, the process determines whether the intersection variable C equals 0. If so, the process has detected a net cut. Hence, it changes the value of the intersection variable C to 1, and adds the net and the current pin to the net list for the identified region of the current pin. However, if the process determines (at 2055) that the intersection variable is not 0, the process has previously detected the net cut. Therefore, the process simply adds (at 2060) the current pin to the net list for the identified region.

From 2060 and 2065, the process transitions to 2070, where it determines whether it has examined the last pin in the current net. If not, the process transitions back to 2035 to examine the next pin in the net. Otherwise, the process (at 2075) (1) adds the intersection cost C to the congestion cost (Cost), and (2) stores the intersection cost C as the cost of the current net.

Next, the process determines (at 2080) whether it has examined the last net. If not, the process returns to 2010 to (1) select another net, (2) partition this net about the cut line, and (3) determine whether this net crosses the cut line. Otherwise, the process returns (at 2085) (1) the congestion cost of the current placement configuration, and (2) the two net lists that represent the partitioning of the received net list about the received cut line.

As mentioned above, a placer can repeatedly perform the process 1900 of FIG. 19 to define a series of cut lines that recursively partition the IC layout into smaller and smaller regions. At each level of the recursion, the placer can then use the process 2000 of FIG. 20 to obtain congestion cost estimate, and to partition nets, across the cut line of that level.

Specifically, for each recursion level, the placer initially supplies the process 2000 with (1) the cut line for that level, and (2) a list of all the nets in that level's region. The process 2000 then (1) partitions the nets in that region about the cut line (i.e., as described above, the process adds the nets and their corresponding pins to the appropriate net lists for the sub-regions created by the cut line), and (2) calculates a cost for the congestion across the cut line.

After receiving from the process 2000 the congestion cost of the initial net configuration within a recursion level's region, the placer then uses an optimization algorithm that iteratively modifies the net configuration within this region to improve the congestion cost generated by the process 2000. In some embodiments, the optimization process uses the process 2000 to calculate the placement-configuration cost for each possible iterative modification to the placement configuration. This is further described below in Section VI, which presents several suitable optimization techniques.

V. Non-recursive Partioning

Some embodiments of the invention compute congestion cost estimates by performing non-recursive partitioning with diagonal cutlines. Specifically, these embodiments use several diagonal cutlines (e.g., several pairs of intersecting orthogonal diagonal cutlines) to partition an IC layout into a number of slots. These embodiments then (1) compute, for each particular diagonal cutline, the net-cut cost corresponding to the number of nets cut by the particular diagonal cutline, (2) square each computed net-cut cost, and (3) add the squared costs. The sum of the squared costs provides a congestion cost estimate. An optimization technique can be used to move the circuit modules to reduce the number of nets intersected by the cut lines. This reduction, in turn, minimizes wire congestion across the cutlines.

Some embodiments perform such diagonal non-recursive parititioning for IC layouts that only have preferred-direction Manhattan interconnect lines. Other embodiments use such partitioning for layouts that use preferred-direction diagonal and Manhattan interconnect lines. Yet others use such partitioning for layouts that only use preferred-direction diagonal interconnect lines. In some instances where the invention is used with diagonal interconnect lines, the diagonal cutlines are in the same direction as some or all of the diagonal interconnect lines. For instance, for IC layouts that use the octagonal wiring model (i.e., that use horizontal, vertical, and 45° diagonal lines), some embodiments use 45° diagonal cutlines.

Also, some embodiments use diagonal partitioning cutlines in conjunction with Manhattan partitioning cutlines. FIG. 24 illustrates one such approach. Specifically, this figure presents an IC layout 2400 that is divided into a number of regions by ten horizontal cutlines 2405, ten vertical cutlines 2410, nine +45° diagonal cutlines 2415, and nine −45° diagonal cutlines 2420. The intersecting diagonal cutlines 2415 and 2420 define a diagonal grid (or mesh), while the intersecting Manhattan cutlines 2405 and 2410 define a Manhattan grid (or mesh). As shown in FIG. 24, each diagonal or Manhattan cutline divides the IC region into two distinct sub-regions. Other embodiments use different numbers of diagonal, horizontal, and/or vertical cutlines.

Figure 25A:
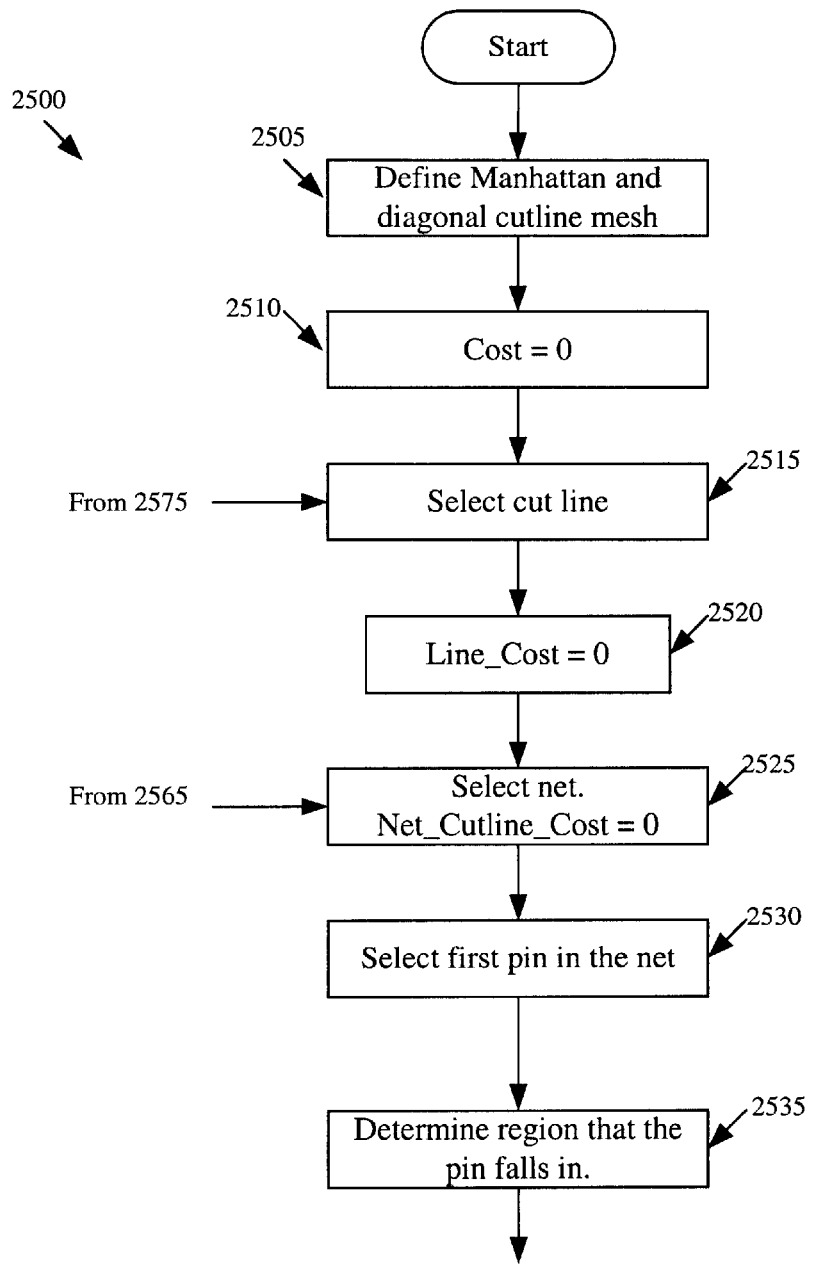
Figure 25B:
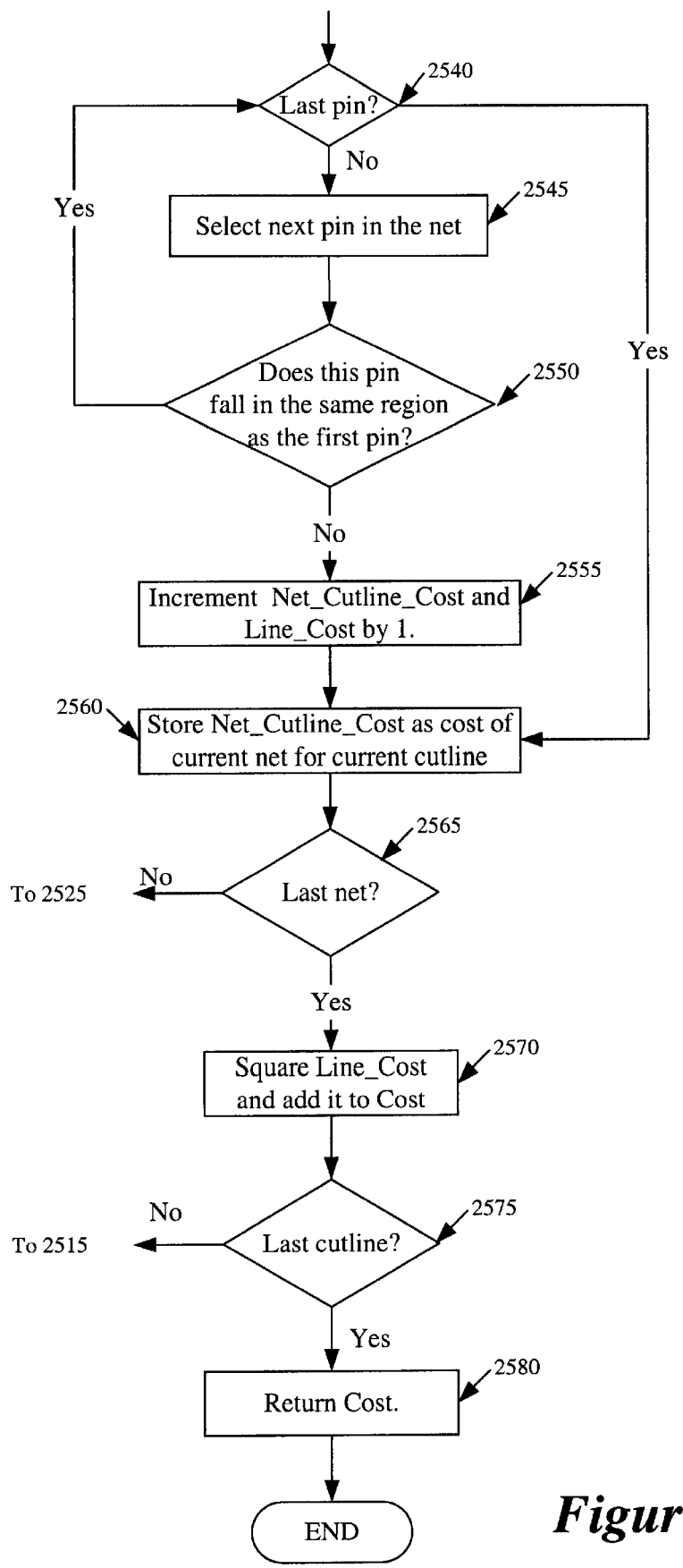

FIG. 25 illustrates a process 2500 for calculating a congestion cost estimate for an embodiment that utilizes a combination of diagonal and Manhattan cutlines, such as the cutlines illustrated in FIG. 24. A placer can use this process to generate a congestion cost estimate for a set of nets on a net list. In some embodiments, the process 2500 starts whenever it receives a net list that specifies a number of nets.

Each received net has several circuit elements associated with it (i.e., each net is defined to include several circuit elements). In other words, the nets on the net list specify the interconnection between some or all the circuit elements in the IC layout. In the embodiments described below, the circuit elements associated with the nets are the pins of the circuit modules in the IC layout. Other embodiments, however, treat the circuit modules as the circuit elements of the nets. Some of these embodiments treat the circuit modules as the net circuit elements and obviate the need to distinguish between the different pin locations, by assuming that the pins of each module are all located at uniform locations (e.g., located at the origin of the modules).

In some embodiments, the positions of the net circuit elements before the process 2500 starts define an initial placement configuration. In some of these embodiments, the initial circuit-element positions are random. In other embodiments, a previous physical-design operation, such as the floor planning, partially or completely specifies the initial positions of these elements. Other embodiments use another placer to specify the initial positions of the circuit elements, and then use process 2500 to optimize the placement configuration for a wiring architecture that uses diagonal wiring.

The process 2500 initially defines (at 2505) crossing Manhattan and diagonal cutlines, such as the cutlines illustrated in FIG. 24. Next, the process sets (at 2510) the congestion cost (Cost) to 0. It then selects (at 2515) one of the cutlines, and sets (at 2520) a line cut cost (Line_Cost) to 0.

The process next selects (at 2525) a net. At 2525, the process also sets a Net_Cutline_Cost variable to 0. For each net, one such variable is defined for each cutline by the time process 2500 is finished. Such a variable for a particular net and a particular cutline defines whether the particular cutline bisects the particular net.

After 2525, the process selects (at 2530) a first pin of the selected net. The process then identifies (at 2535) the location of the selected first pin with respect to the cutline. In some embodiments, the process 2500 (1) uses the process 2100 to identify the location of the select with respect to a horizontal cutline, (2) uses the process 2200 to identify the location of the select with respect to a vertical cutline, and (3) uses the process 2300 to identify the location of the select with respect to diagonal cutline.

Next, the process determines (at 2540) whether it has examined all the pins for the current net. If so, the process transitions to 2560, which will be described below. Otherwise, the process selects (at 2545) the next pin in the net. The process then determines (a 2550) whether the pin selected at 2545 falls on the same side of the cutline as the first pin. If so, the process transitions back to 2540 to determine whether it needs to examine any additional pins (i.e., whether any additional unexamined pins remain in the net).

However, if the process determines (at 2550) that the pin selected at 2545 falls on a different side of the cutline than the first pin, the process has detected a net cut, and thereby increments (at 2555) the Net_Cutline_Cost and Line_Cost variables by one.

At 2560, the process stores the Net_Cutline_Cost as the cost of the current net for the current cutline. Next, the.process determines (at 2565) whether it has examined all the nets. If not, the process transitions back to 2525 to select the next net, so that it can repeat the process to determine whether the current cutline intersects the next net.

On the other hand, if the process determines (at 2565) that it has examined all the nets for the current cutline, the process (at 2570) squares the cutline's cost (Line Cost), and adds this squared value to the congestion cost (Cost). The process then determines (at 2575) whether it has examined all the cutlines. If not, the process transitions back to 2515 to select another cutline, so that it can repeat the process to determine the next cutline's net-cut cost (Line_Cost). Otherwise, the process returns (at 2580) the computed congestion cost (Cost), and then ends.

In some embodiments of the invention, the process 2500 generates a congestion cost estimate for an initial placement configuration, when it receives a net list that specifies the initial placement configuration (i.e., a net list that identifies all the nets in the IC layout before any modifications to the positions of the modules in the layout). Some embodiments also use this process to calculate the placement-configuration cost for each possible iterative modification to the placement configuration that is made by an optimization process, such as one of those described in Section VI below.

VI. Optimization Techniques

As mentioned above, the invention's cost-calculating methods can be used with a variety of optimization techniques. Three suitable optimization techniques are described below. These three are: (1) local optimization, (2) simulated annealing, and (3) KLFM.

A. Local Optimization.

Local optimization is a technique that iteratively modifies the placement configuration to improve the placement score generated by a cost-calculating function. At each iteration, this technique might move one circuit module, swap two modules, or move a number of related modules, etc. Also, at each iteration, this technique randomly selects moves. In addition, this techniques does not accept moves that make the calculated cost worse.

Figure 26A:
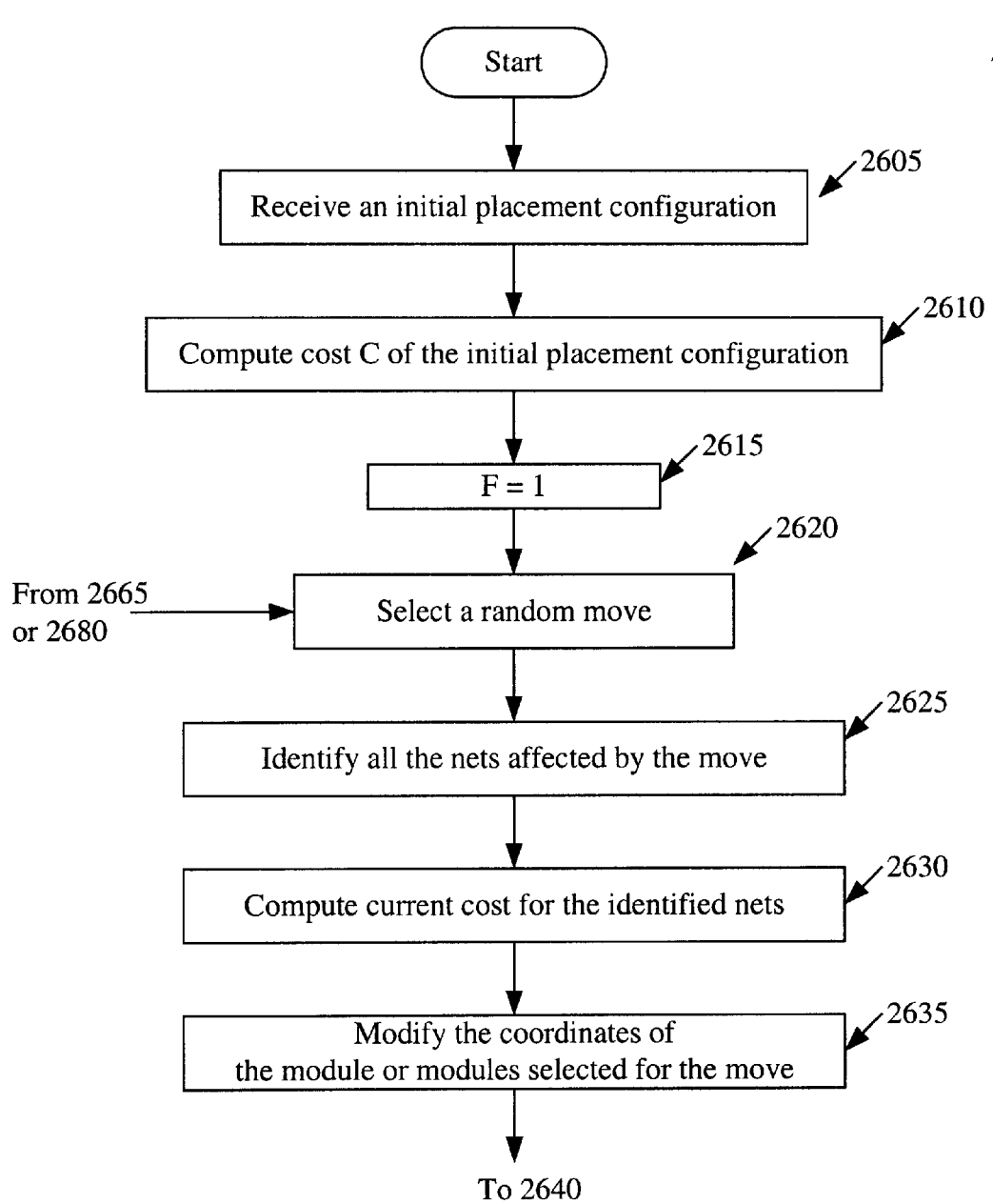
Figure 26B:
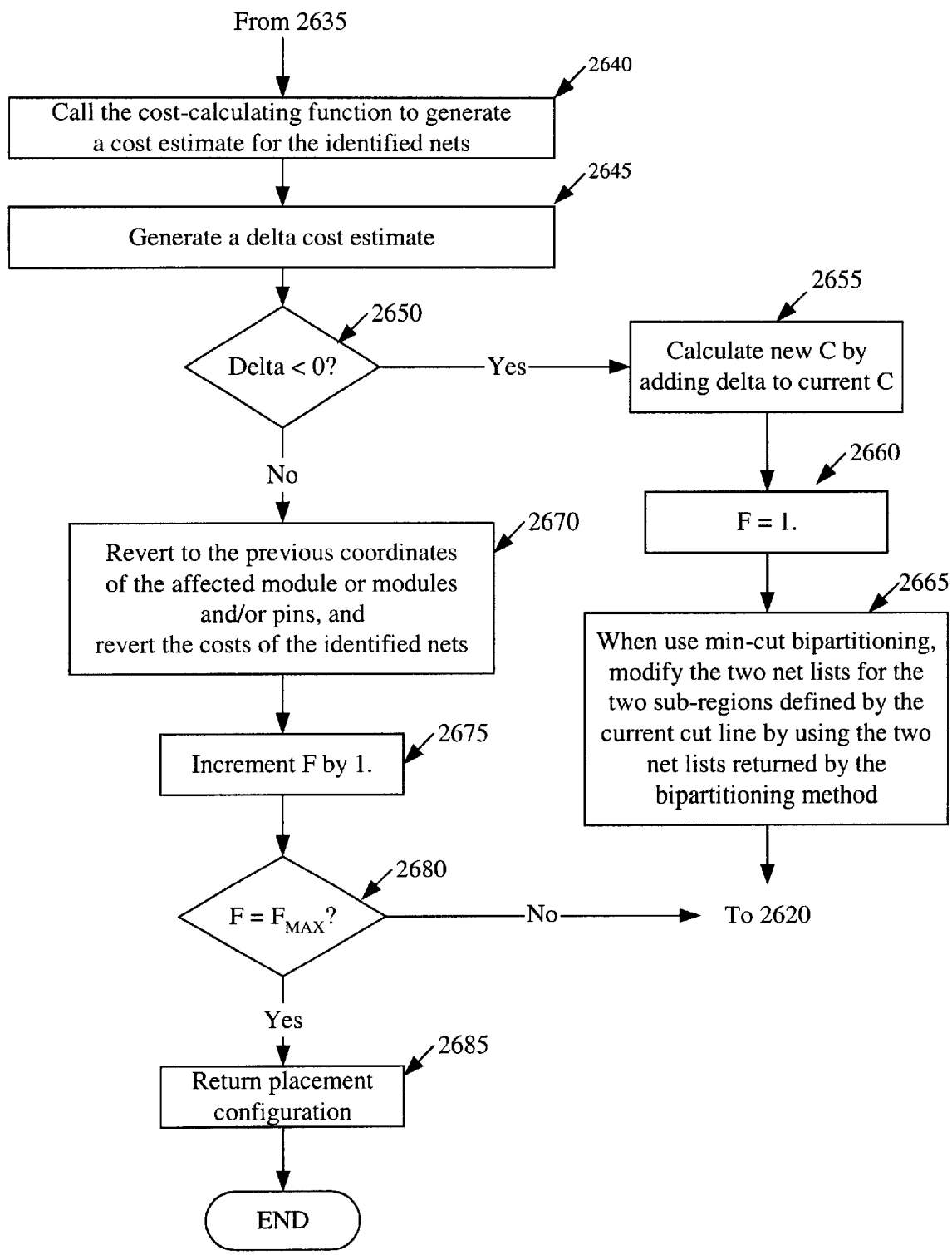

FIG. 26 illustrates one example of a local optimization process 2600. This process initially receives (at 2605) an initial placement configuration. In some embodiments, the process receives the initial configuration by receiving a list of circuit modules, a starting placement configuration for these modules, and a net list that specifies the interconnection between these modules.

After receiving the initial placement configuration, the process 2600 calls (at 2610) a cost-calculating method, like one of the cost-calculating methods described above in Sections II–V. In response, this cost-calculating method computes and returns the cost (C) of the initial placement configuration.

When the process 2600 calls the cost-calculating method, it supplies this method with a net list that specifies the initial placement configuration (i.e., a net list that identifies all the nets in the IC layout before any modifications to the positions of the modules in the layout).

Also, when the cost-calculating method is the bipartitioning process 2000 described above, the process 2600 calls the process 1900 before calling the process 2000. As described above, the process 1900 defines a cut line for the current IC region being optimized by the optimization process 2600. The process 2600 supplies the congestion-calculating process 2000 with this cut line along with the initial-configuration's net list, in order to receive from the process 2000 the net-cut congestion cost (C) of the initial placement configuration. From the process 2000, the process 2600 also receives two net lists that specify the nets and the pins in the two regions defined by the current cut line.

After obtaining cost of the initial placement configuration at 2610, the process sets (at 2615) a futile-iteration counter (F) equal to 1. As further described below, the process uses counter to determine whether it needs to terminate its operation as it has performed a predetermined number of iterations without improving the score.

The process then selects (at 2620) a random move that requires the modification of the coordinates of one or more circuit modules in the IC layout. The process next identifies (at 2625) all the nets affected by this random move. Depending on how nets are defined, these nets are the nets that either (1) contain the circuit module or modules selected for the move, or (2) contain the pins of these circuit modules.

At 2630, the process computes the current cost for the nets identified at 2625. As mentioned above, the cost calculating processes 1100, 1300, 1500, 2000 and 2500 store the cost for each net. Hence, for process 1100, 1300, 1500, and 2000, the process 2600 can compute the current cost for the identified nets by summing the stored cost values for these nets. However, for process 2500, the process 2600 calculates the current cost for the identified nets by (1) summing for each cutline the Net_Cutline_Cost of all the identified nets, (2) squaring each sum, and (3) adding the squared values.

According to the selected random move, the process 2600 modifies (at 2635) the coordinates of each circuit module and/or pin affected by the move. In other words, at 2635, the process makes the move by modifying the coordinates of the affected circuit module or modules and/or their associated pins to match the random location identified at 2620.

The process then calls the cost-calculating process and supplies this process with a net list that specifies the identified nets that are affected by the selected move. This net list specifies the configuration of the identified nets after the selected move, since the process 2600 modified the coordinates of the affected circuit modules and/or pins at 2635. In the embodiments where the cost-calculating process is the bipartitioning process 2000, the process 2600 supplies this process 2000 with the cut line for the current IC region being optimized, along with the list of the identified nets.

In response to the call at 2640, the cost-calculating method computes and returns the cost (C) for the configuration of the identified nets after the potential modification. When the cost-calculating method is the bipartitioning process 2000, this process also partitions the identified nets about the cut line, and returns two net lists that reflect this partitioning.

After receiving (at 2640) the cost for the identified nets after the potential modification, the process generates (at 2645) a delta cost by subtracting the cost for the identified nets after the potential modification (i.e., the cost calculated at 2640) from the cost for the identified nets before the potential modification (i.e., the cost calculated at 2630)

At 2650, the process determines whether the delta cost is less than zero. If so, the selected move reduces the placement cost, and the process decides to retain the move. Specifically, when the delta cost is less than zero, the process sets (at 2655) the cost of the current placement configuration (i.e., the placement configuration with the selected move) equal to the cost of the previous placement configuration (i.e., the placement configuration without the selected move) plus the delta cost. The delta cost is negative and thereby reduces the overall placement configuration cost C.

The process 2600 then resets (at 2660) the futile-iteration counter F to 1. Also, when the cost-calculating method is the bipartitioning method 2000, the process 2600 uses the two net lists returned by the method 2000 at 2640 to modify the two net lists for the two sub-regions defined by the current cut line. The process then returns to 2620 to select another random move.

If the process determines (at 2650) that the delta cost is not less than zero, the selected move does not reduce the placement cost. Consequently, the process changes (at 2670) the coordinates of the affected circuit module or modules and/or their corresponding pins back to their original coordinates before the move (i.e., their coordinates before 2635). The process also changes the cost of each of the identified nets back to its original value (i.e., back to the cost stored for the net before 2640). It should be noted that when the process 2600 uses process 2500 as the cost-calculating process, the process 2600 changes each net's Net_Cutline_ Cost for each cutline back to its original value before the modification.

The process then increments (at 2675) the futile-iteration counter by one. The process then determines (at 2680) whether the futile-iteration count equals a pre-specified maximum. If not, the process returns to 2620 to select another random move. Otherwise, the process has performed a pre-specified maximum number of iterations without improving the placement score. Hence, the process returns (at 2685) a net list specifying the current placement configuration, and then ends.

B. Simulated Annealing.

Simulated annealing is an optimization technique that iteratively modifies the placement configuration to improve the placement score generated by a cost-calculating function. At each iteration, this technique might move one circuit module, swap two modules, move a number of related modules, etc. Also, at each iteration, this technique randomly selects moves. It also accepts moves that make the calculated cost worse, but its tolerates fewer bad moves as the number of iterations increases.

Figure 27A:
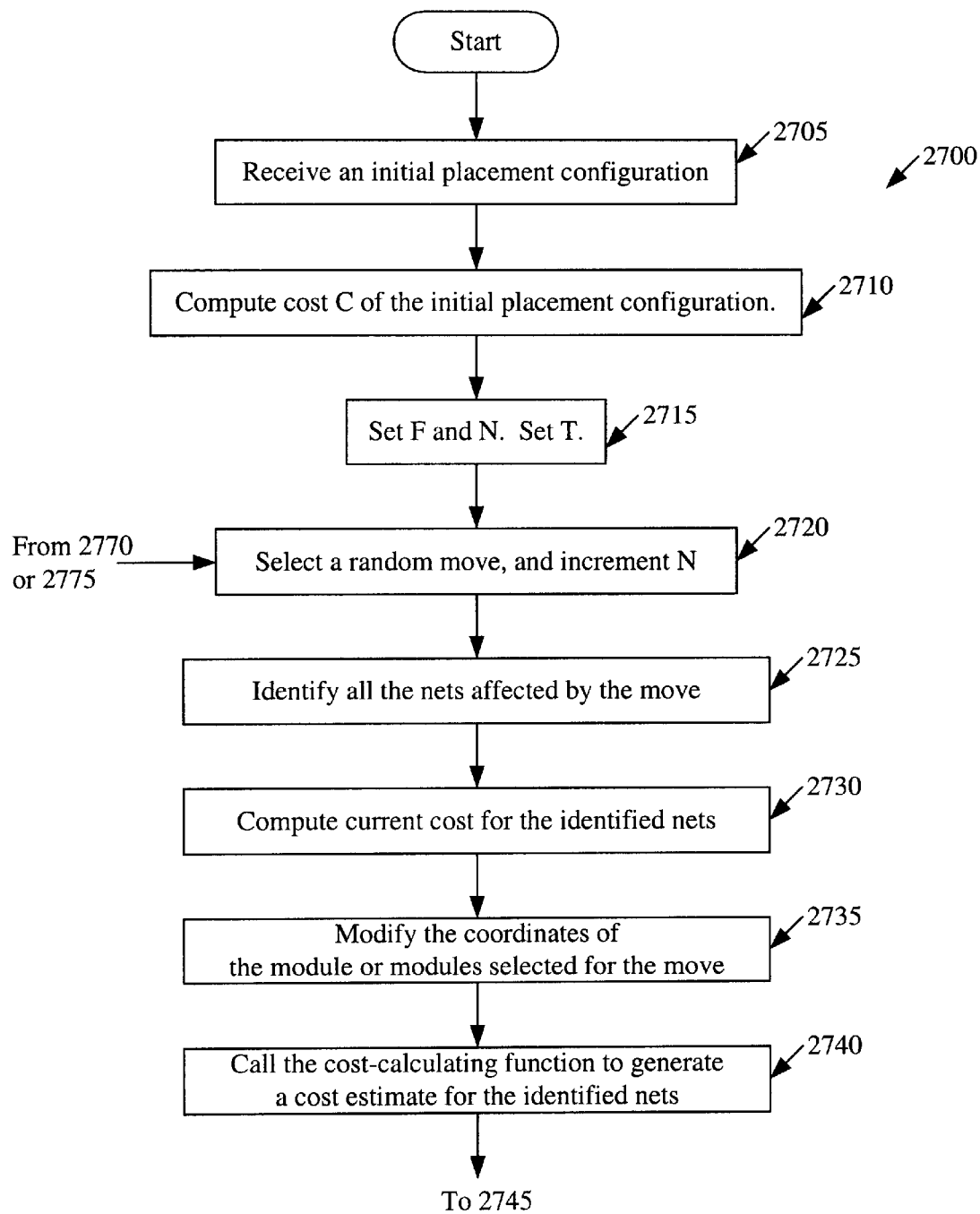
Figure 27B:
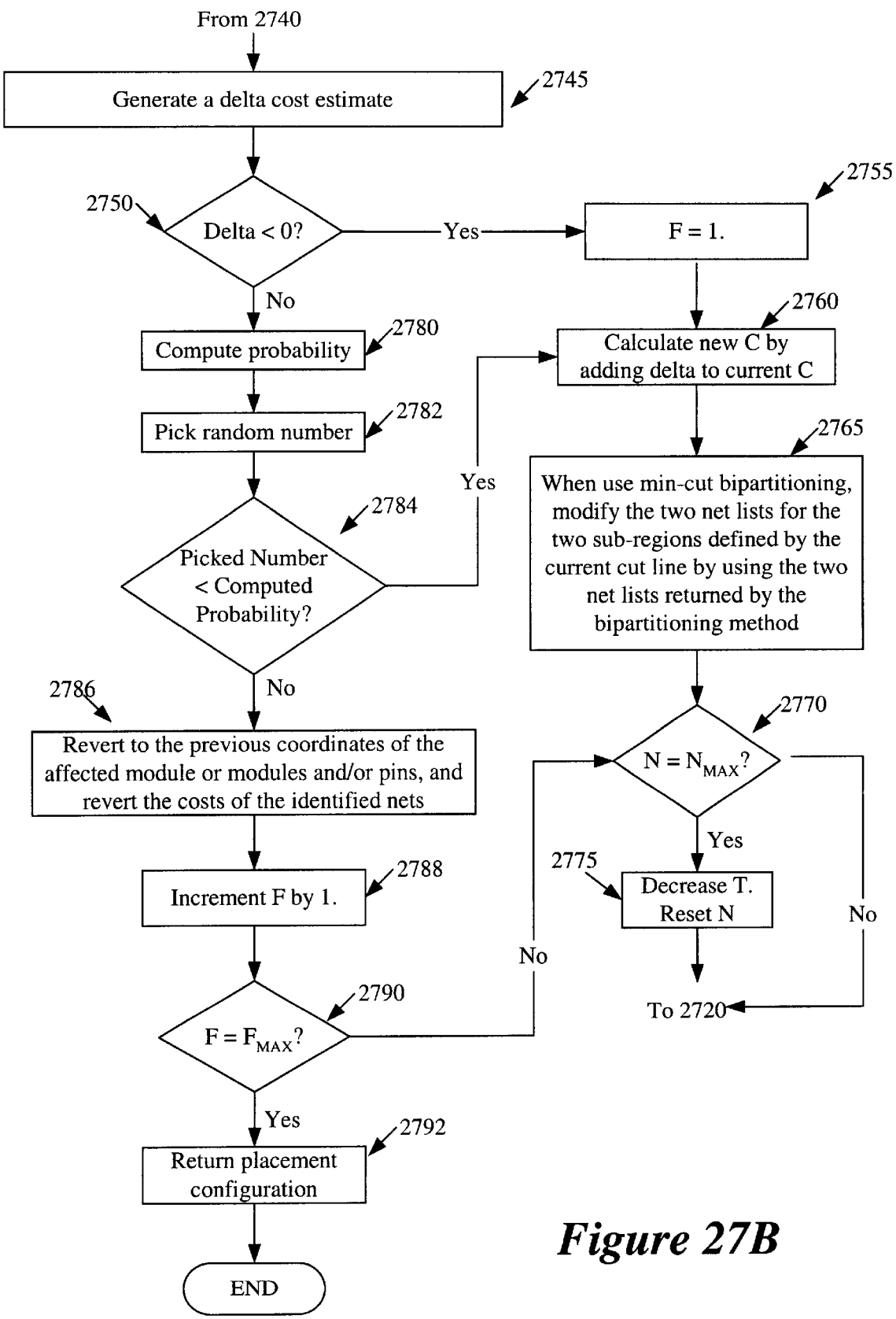

FIG. 27 illustrates one example of a simulated annealing process 2700. This process initially receives (at 2705) an initial placement configuration. In some embodiments, the process receives the initial configuration by receiving a list of circuit modules, a starting placement configuration for these modules, and a net list that specifies the interconnection between these modules.

After receiving the initial placement configuration, the process 2700 calls (at 2710) a cost-calculating method, like one of the cost-calculating methods described above in Sections II–V. In response, this cost-calculating method computes and returns the cost (C) of the initial placement configuration.

When the process 2700 calls the cost-calculating method, it supplies this method with a net list that specifies the initial placement configuration (i.e., a net list that identifies all the nets in the IC layout before any modifications to the positions of the modules in the layout).

Also, when the cost-calculating method is the bipartitioning process 2000 described above, the process 2700 calls the process 1900 before calling the process 2000. As described above, the process 1900 defines a cut line for the current IC region being optimized by the optimization process 2700. The process 2700 supplies the congestion-calculating process 2000 with this cut line along with the initial-configuration's net list, in order to receive from the process 2000 the net-cut congestion cost (C) of the initial placement configuration. From the process 2000, the process 2700 also receives two net lists that specify the nets and the pins in the two regions defined by the current cut line.

After obtaining cost of the initial placement configuration at 2710, the process sets (at 2715) a futile-iteration counter (F) equal to 1. As further described below, the process uses counter to determine whether it needs to terminate its operation as it has performed a predetermined number of iterations without improving the score.

At 2715, the process also sets an annealing "temperature" T and iteration counter N. As further described below, the annealing temperature determines how likely the process 2700 will accept bad moves. The iteration counter is used to decrease this temperature over time, so as to make process 2700 less and less willing to accept bad moves.

At 2720, the process then (1) selects a random move that requires the modification of the coordinates of one or more circuit modules in the IC layout, and (2) increments the iteration counter N. The process next identifies (at 2725) all the nets affected by this random move. Depending on how nets are defined, these nets are the nets that either (1) contain the circuit module or modules selected for the move, or (2) contain the pins of these circuit modules.

At 2730, the process computes the current cost for the nets identified at 2725. As mentioned above, the cost calculating processes 1100, 1300, 1500, 2000 and 2500 store the cost for each net. Hence, for process 1100, 1300, 1500, and 2000, the process 2700 can compute the current cost for the identified nets by summing the stored cost values for these nets. However, for process 2500, the process 2700 calculates the current cost for the identified nets by (1) summing for each cutline the Net_Cutline_Cost of all the identified nets, (2) squaring each sum, and (3) adding the squared values.

According to the selected random move, the process 2700 modifies (at 2735) the coordinates of each circuit module and/or pin affected by the move. In other words, at 2735, the process makes the move by modifying the coordinates of the affected circuit module or modules and/or their associated pins to match the random location identified at 2720.

The process then calls the cost-calculating process and supplies this process with a net list that specifies the identified nets that are affected by the selected move. This net list specifies the configuration of the identified nets after the selected move, since the process 2700 modified the coordinates of the affected circuit modules and/or pins at 2735. In the embodiments where the cost-calculating process is the bipartitioning process 2000, the process 2700 supplies this process 2000 with the cut line for the current IC region being optimized, along with the list of the identified nets.

In response to the call at 2740, the cost-calculating method computes and returns he cost for the configuration of the identified nets after the potential modification. When the cost-calculating method is the bipartitioning process 2000, this process also partitions the identified nets about the cut line, and returns two net lists that reflect this partitioning.

After receiving (at 2740) the cost for the identified nets after the potential modification, the process generates (at 2745) a delta cost by subtracting the cost for the identified nets after the potential modification (i.e., the cost calculated at 2740) from the cost for the identified nets before the potential modification (i.e., the cost calculated at 2730)

At 2750, the process determines whether the delta cost is less than zero. If so, the selected move reduces the placement cost, and the process decides to retain the move. Specifically, when the delta cost is less than zero, the process resets (at 2755) the futile-iteration counter F to 1. The process then sets (at 2760) the cost of the current placement configuration (i.e., the placement configuration with the selected move) equal to the cost of the previous placement configuration (i.e., the placement configuration without the selected move) plus the delta cost. The delta cost is negative and thereby reduces the overall placement configuration cost C. Also, when the cost-calculating method is the bipartitioning method 2000, the process 2700 uses (at 2765) the two net lists returned by the method 2000 at 2740 to modify the two net lists for the two sub-regions defined by the current cut line.

The process next determines (at 2770) whether the iteration counter N has reached a maximum. If not, the process returns to 2720 to select another random move. Otherwise, the process decreases the annealing temperature and resets the iteration counter at 2775, and then returns to 2720 to select another random move.

If the process determines (at 2750) that the delta cost is not less than zero, the process computes (at 2780) a probability between 0 and 1. In some embodiments, the equation for computing the probability equals $e^{-(Delta)T}$, where Delta is the value computed at 2745 and T is the annealing temperature.

Next, the process picks (at 2782) a random number between 0 and 1. At 2784, the process then determines whether the random number is less than the computed probability. If so, the process decides to make the move, and thereby transitions to 2760 to perform the other operations associated with the move, as described above.

If the selected random number is not less than the computed probability, the process changes (at 2786) the coordinates of the affected circuit module or modules and/or their corresponding pins back to their original coordinates before the move (i.e., their coordinates before 2735). At 2786, the process also changes the cost of each of the identified nets back to its original value (i.e., back to the cost stored for the net before 2740). It should be noted that when the process 2700 uses process 2500 as the cost-calculating process, the process 2700 changes each net's Net_Cutline_Cost for each cutline back to its original value before the modification.

The process then increments (at 2788) the futile-iteration counter by one. The process then determines (at 2790)

whether the futile-iteration count equals a pre-specified maximum. If not, the process transitions to 2770, which was described above. Otherwise, the process has performed a pre-specified maximum number of iterations without improving the placement score. Hence, the process returns (at 2792) a net list specifying the current placement configuration, and then ends.

C. KLFM.

KLFM is an optimization technique that iteratively modifies the placement configuration to improve the placement score generated by a cost-calculating function. At each iteration, this technique might move one circuit module, swap two modules, move a number of related modules, etc. Unlike local optimization and simulated annealing, KLFM does not randomly select moves. Instead, at each iteration, it selects the best move over all the possible moves that it can make. KLFM will make moves that make the placement cost worse. Over an entire sweep, it then identifies the best placement configuration that it sees, and if that best placement configuration has a better cost than the original placement configuration, KLFM starts over with the improved solution.

Figure 28A:
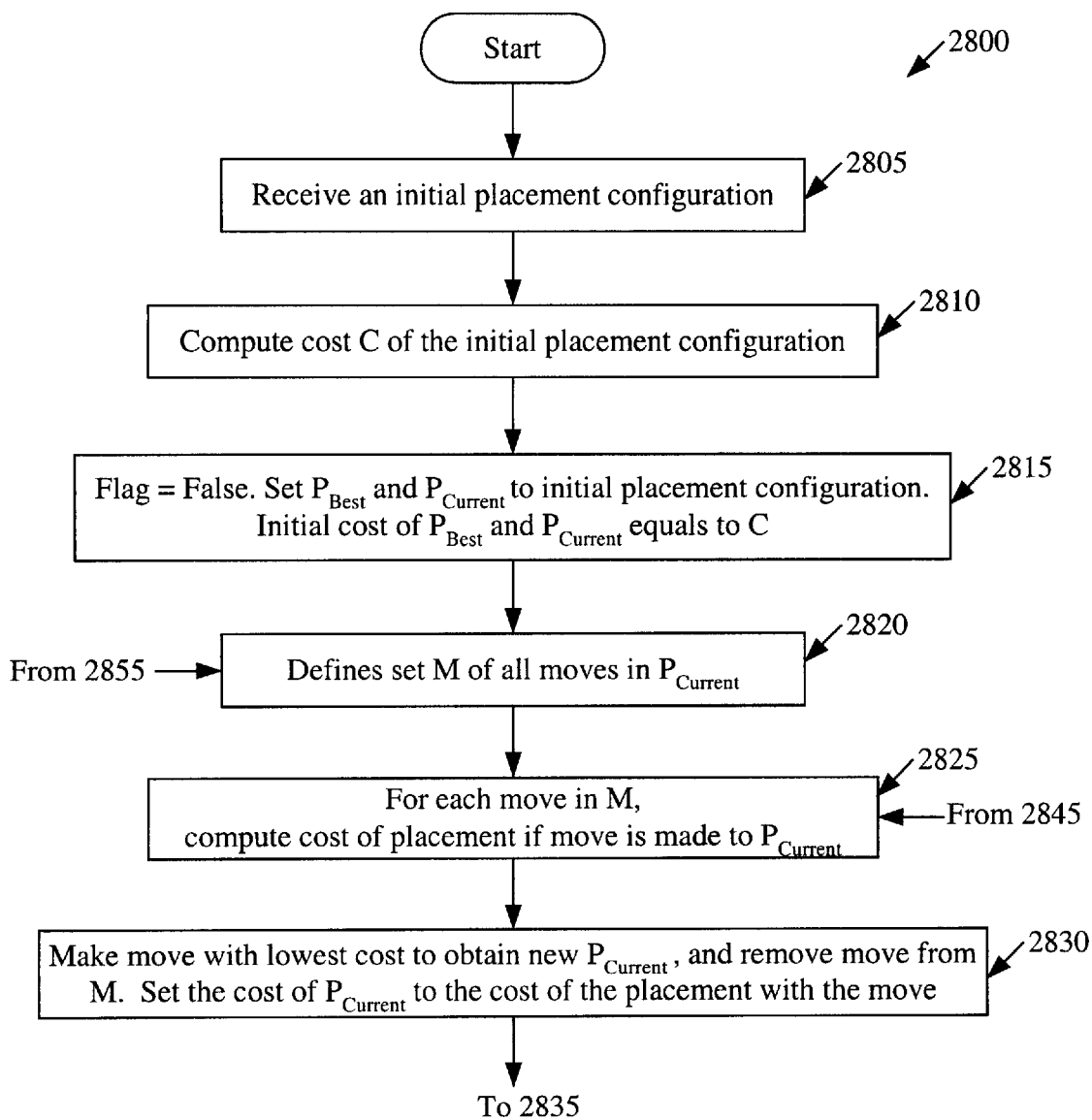
Figure 28B:
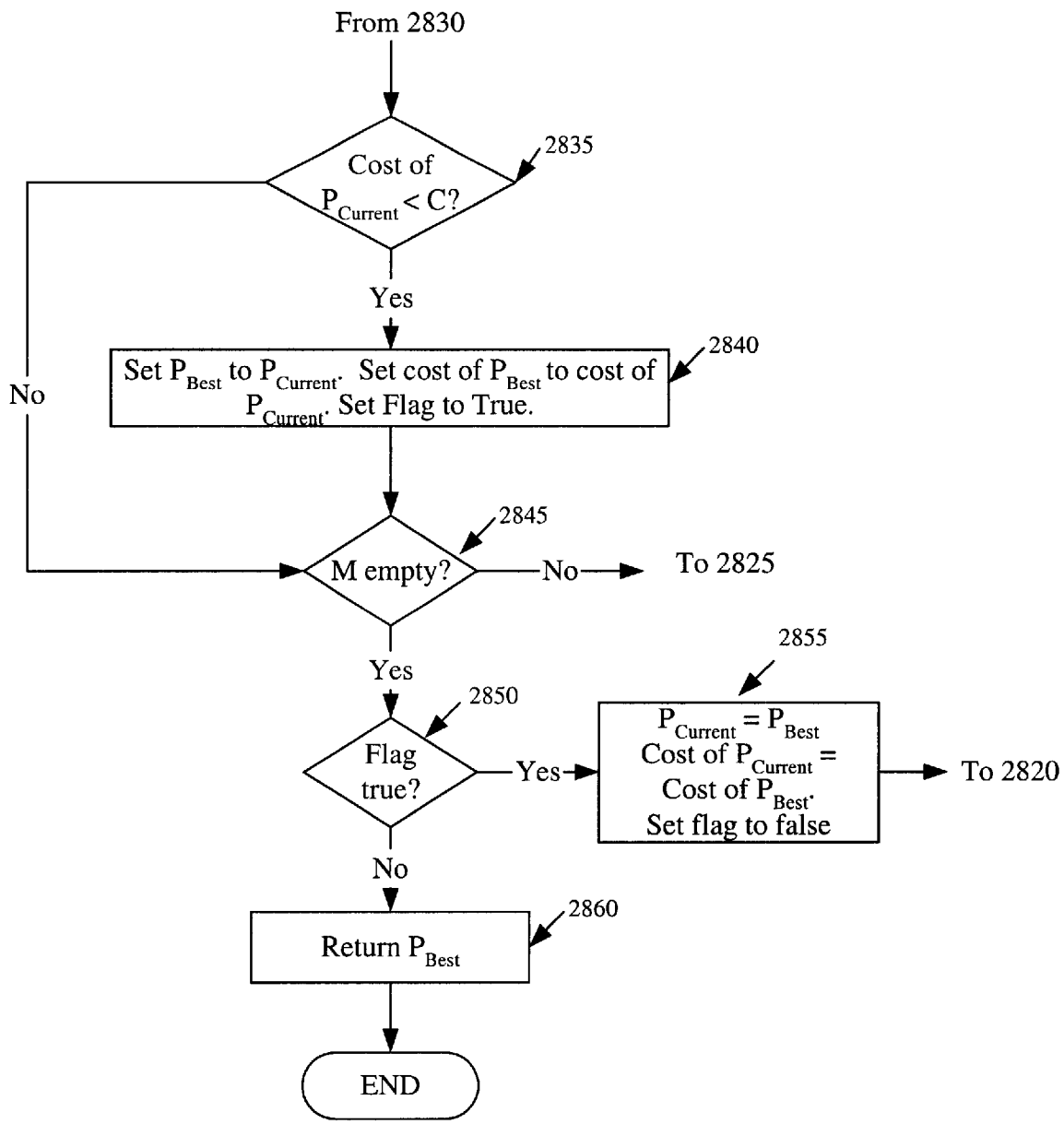

FIG. 28 illustrates one example of a KLFM process 2800. This process initially receives (at 2805) an initial placement configuration. In some embodiments, the process receives the initial configuration by receiving a list of circuit modules, a starting placement configuration for these modules, and a net list that specifies the interconnection between these modules.

After receiving the initial placement configuration, the process 2800 calls (at 2810) a cost-calculating method, like one of the cost-calculating methods described above in Sections II–V. In response, this cost-calculating method computes and returns the cost (C) of the initial placement configuration.

When the process 2800 calls the cost-calculating method, it supplies this method with a net list that specifies the initial placement configuration (i.e., a net list that identifies all the nets in the IC layout before any modifications to the positions of the modules in the layout).

Also, when the cost-calculating method is the bipartitioning process 2000 described above, the process 2800 calls the process 1900 before calling the process 2000. As described above, the process 1900 defines a cut line for the current IC region being optimized by the optimization process 2800. The process 2800 supplies the congestion-calculating process 2000 with this cut line along with the initial-configuration's net list, in order to receive from the process 2000 the net-cut congestion cost (C) of the initial placement configuration. From the process 2000, the process 2800 also receives two net lists that specify the nets and the pins in the two regions defined by the current cut line.

After obtaining cost of the initial placement configuration at 2810, the process sets (at 2815) a flag (F) equal to false. As further described below, the process uses this flag after performing a number of moves to determine whether any of the moves improved the placement-configuration score. At 2815, the process also (1) identifies the initial placement configuration as the current and best placement configurations, and (2) initializes the costs of the current and best configurations to the cost of the initial configuration.

Next, the process defines (at 2820) a set M of all moves in the current placement configuration ($P_{Current}$) For each move in M, the process computes (at 2825) the cost (C) of the placement configuration after the move. To compute the cost of each move, the process performs the following six operations. First, the process (1) identifies all the nets affected by the move, and (2) computes the current cost for the identified nets by summing the stored cost values for these nets. Second, the process modifies the coordinates of each circuit element affected by the move according to the move.

Third, it supplies the cost-calculating process with a net list that specifies the identified nets that are affected by the selected move. When the cost-calculating process is the bipartitioning process 2000, the process 2800 also supplies the cost-calculating process with the cut line for the current IC region. From the cost-calculating process, the process 2800 receives the cost for the identified nets after the potential move. When the cost-calculating process is the bipartitioning process 2000, the process 2800 also receives two net lists that represent the partitioning of the identified net list by the process 2000.

Fourth, after receiving the cost for the identified nets after the potential modification, the process generates a delta cost by subtracting the cost for the identified nets after the potential modification from the cost for the identified nets before the potential modification.

Fifth, the process generates the cost of the move by adding the computed delta cost to the cost of the current placement configuration. Sixth, the process (1) changes the coordinates of the affected circuit elements (modules and/or pins) back to their original coordinates before the move, and (2) changes the cost of each of the identified nets back to its original value before the move.

At 2830, the process makes the move with the lowest placement-configuration cost to obtain a new current placement configuration $P_{Current}$. At this stage, the process also removes the selected move from the set M of possible moves. The process also sets the cost of the current placement configuration equal to the cost of the placement after the move. Also, when the cost-calculating method is the bipartitioning method 2000, the process modifies (at 2830) the two net lists for the two sub-regions defined by the current cut line by using the two net lists returned by this method at 2825 for the move.

The process then determines (at 2835) whether the cost of the current placement configuration (i.e., the configuration obtained at 2830) is less than the lowest placement-configuration cost yet seen. If not, the process transitions to 2845, which will be described below. Otherwise, the process (at 2840) (1) defines the best placement configuration to be the current placement configuration, (2) sets the cost of the best placement configuration to the cost of the current placement configuration, and (3) sets the flag (F) to true to indicate that at least one of the performed moves improved the placement cost. The process then transitions to 2845.

At 2845, the process determines whether the set M of possible moves is empty. If not, the process transitions back to 2825 to compute, for each remaining move in the set, the cost (C) of the placement configuration after the move. The process recomputes the cost associated with the moves because the previous move might have affected the placement configuration costs for the remaining moves.

If the process determines (at 2845) that the set M is empty, the process determines that it has performed all the moves in the set defined at 2820. Consequently, the process determines (at 2850) whether one of the performed moves improved the placement cost by determining whether the flag (F) is set to true.

If the flag is true, the process (at 2855) (1) sets the current placement configuration equal to the best placement configuration identified in the last sweep through the moves, (2) define the cost of the current placement configuration equal to the cost of the best placement configuration, and (3) sets the flag (F) to true. The process then returns to 2820 to repeat for the current placement configuration, in order to determine whether it can improve on this configuration.

If the process determines (at 2850) that the flag is false, the process returns (at 2860) the best placement configuration that it identified as the final placement configuration. The process then ends.

II. The Computer System

Figure 29:
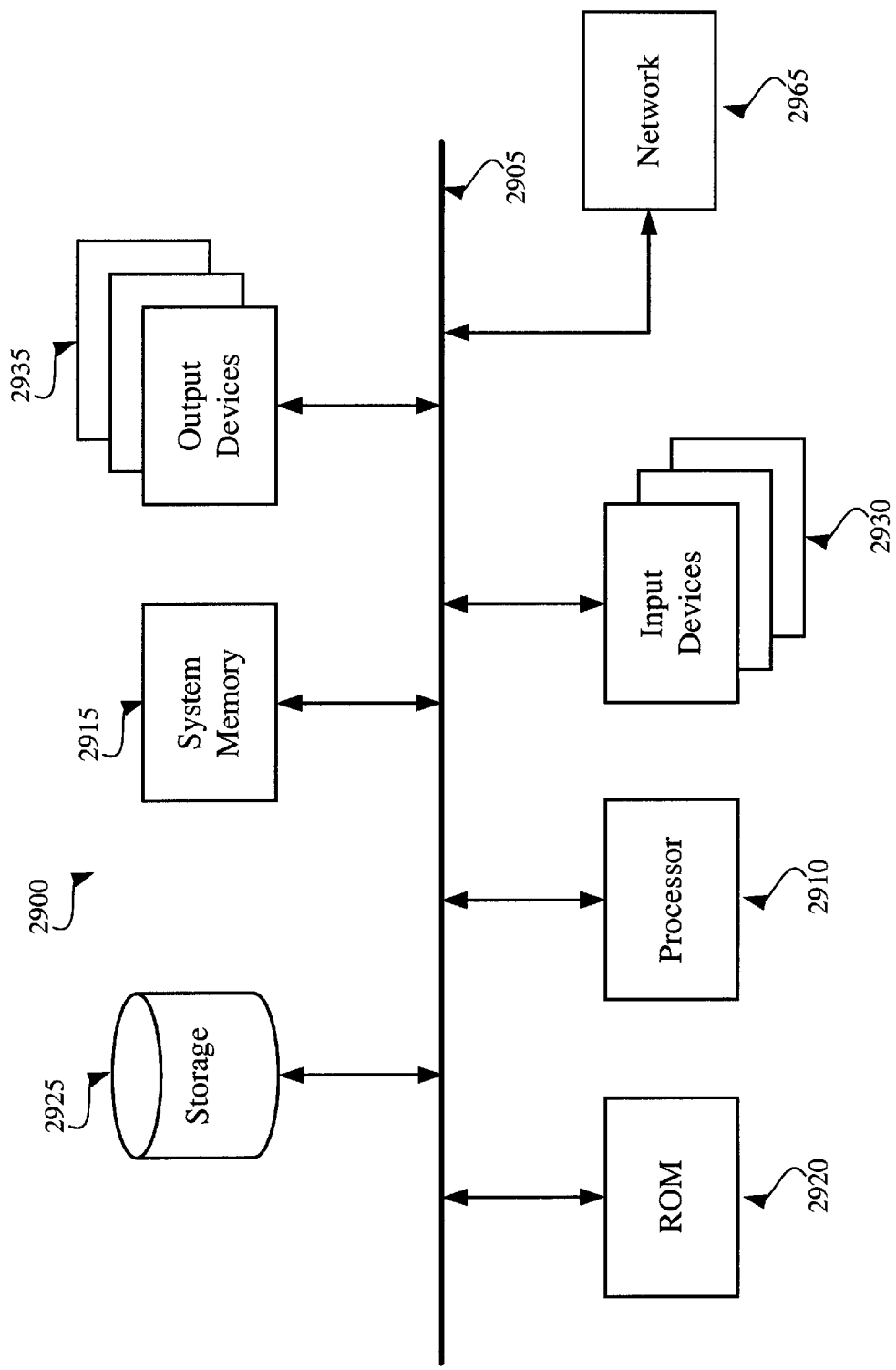
FIG. 29 illustrates a computer system used by some embodiments of the invention.

FIG. 29 presents a computer system with which one embodiment of the present invention is implemented. Computer system 2900 includes a bus 2905, a processor 2910, a system memory 2915, a read-only memory 2920, a permanent storage device 2925, input devices 2930, and output devices 2935.

The bus 2905 collectively represents all system, peripheral, and chipset buses that communicatively connect the numerous internal devices of the computer system 2900. For instance, the bus 2905 communicatively connects the processor 2910 with the read-only memory 2920, the system memory 2915, and the permanent storage device 2925.

From these various memory units, the processor 2910 retrieves instructions to execute and data to process in order to execute the processes of the invention. The read-only memory (ROM) 2920 stores static data and instructions that are needed by the processor 2910 and other modules of the computer system. The permanent storage device 2925, on the other hand, is read-and-write memory device. This device is a non-volatile memory unit that stores instruction and data even when the computer system 2900 is off. Some embodiments of the invention use a mass-storage device (such as a magnetic or optical disk and its corresponding disk drive) as the permanent storage device 2925. Other embodiments use a removable storage device (such as a floppy disk or zips® disk, and its corresponding disk drive) as the permanent storage device.

Like the permanent storage device 2925, the system memory 2915 is a read-and-write memory device. However, unlike storage device 2925, the system memory is a volatile read-and-write memory, such as a random access memory. The system memory stores some of the instructions and data that the processor needs at runtime. In some embodiments, the invention's processes are stored in the system memory 2915, the permanent storage device 2925, and/or the read-only memory 2920.

The bus 105 also connects to the input and output devices 2930 and 2935. The input devices enable the user to communicate information and select commands to the computer system. The input devices 2930 include alphanumeric keyboards and cursor-controllers.

The output devices 2935 display images generated by the computer system. For instance, these devices display IC design layouts. The output devices include printers and display devices, such as cathode ray tubes (CRT) or liquid crystal displays (LCD).

Finally, as shown in FIG. 29, bus 2905 also couples computer 2900 to a network 2965 through a network adapter (not shown). In this manner, the computer can be a part of a network of computers (such as a local area network ("LAN"), a wide area network ("WAN"), or an Intranet) or a network of networks (such as the Internet).

Any or all of the components of computer system 2900 may be used in conjunction with the invention. However, one of ordinary skill in the art would appreciate that any other system configuration may also be used in conjunction with the present invention.

III. Advantages.

The embodiments of the invention that factor diagonal, horizontal, and vertical wiring during placement, result in the better distribution of the nets when such wiring is used to route the nets. When the router uses diagonal, horizontal, and vertical wiring but the placer is optimized only for Manhattan wiring, the placer poorly positions the nets in the IC layout. Specifically, in these situations, the placer has a tendency to ignore diagonal positions, since it is inclined to place all circuit elements related to a particular circuit element directly above or below, or directly to the right or left, of the particular circuit element.

On the other hand, when a placer is optimized for diagonal, horizontal, and vertical wiring, such a placer is less inclined to ignore diagonal positions. Hence, such a placer places related circuit elements in horizontal, vertical, or diagonal positions with respect to each other. This, in turn, provides for a more uniform distribution of related circuit elements.

In other words, a placer that is optimized for horizontal, vertical, and diagonal wiring can position the circuit modules in more locations that cost the same. This ability, in turn, opens up more positions to place the circuit modules, and thereby reduces wirelength.

While the invention has been described with reference to numerous specific details, one of ordinary skill in the art will recognize that the invention can be embodied in other specific forms without departing from the spirit of the invention. For instance, while the above-described wirelength calculating processes compute their total costs by summing the wirelength cost for each net, other embodiments might compute their total wirelength costs by combining the net wirelength costs in a different manner (e.g., they might multiply their computed net wirelength costs). Thus, one of ordinary skill in the art would understand that the invention is not to be limited by the foregoing illustrative details, but rather is to be defined by the appended claims.

We claim:

1. For an electronic design automation placer that defines positions of circuit modules in an integrated circuit ("IC") layout, wherein the placer uses a set of nets and each net specifies a set of circuit elements in the layout, a method for computing placement-configuration costs comprising:
   a) defining a plurality of diagonal partitioning cutlines, wherein each diagonal cutline defines two sub-regions of a region of the IC layout;
   b) for each particular diagonal cutline, calculating the number of nets that have circuit elements in both the sub-regions defined by the particular diagonal cutline; and
   c) computing a cost estimate based on the calculated numbers.

2. The method of claim 1, wherein computing a cost estimate comprises:
   a) squaring each calculated number; and
   b) summing the squared calculated numbers to obtain a congestion cost estimate.

3. The method of claim 1 further comprising:
   a) defining a plurality of Manhattan partitioning cutlines, wherein each Manhattan cutline defines two sub-regions of the region of the IC layout;
   b) for each Manhattan cutline, calculating the number of nets that have circuit elements in both the sub-regions defined by the particular Manhattan cutline;
   c) computing a cost estimate based on the calculated numbers.

4. The method of claim 1, wherein the layout is to be routed by the Manhattan wiring model.

5. The method of claim 1, wherein the layout is to be routed by the Manhattan and diagonal wiring models.

6. The method of claim 1, wherein the layout is to be routed by using preferred-direction diagonal interconnect lines.

7. The method of claim 6, wherein the direction of at least some of the diagonal cutlines matches the direction of at least some of the diagonal interconnect lines.

8. The method of claim 1 further comprising changing the positions of a set of circuit elements in said region to reduce the number of nets intersected by said cutlines.

9. The method of claim 8 wherein changing the positions of the circuit elements comprises using a KLFM optimization process.

10. The method of claim 8 wherein changing the positions of the circuit elements comprises using annealing optimization process.

11. The method of claim 8 wherein changing the positions of the circuit elements comprises using a local optimization process.

12. For a placer that defines positions of circuit modules in an integrated circuit ("IC") layout, wherein the placer defines a set of nets, and each net specifies a set of circuit elements in the layout, a method of computing cost estimates for placement configurations, the method comprising:

a) defining a plurality of cutlines, wherein each cutline partitions the IC layout into two sub-regions, wherein at least one of said cutlines is diagonal and one of said cutlines is not diagonal, b) for each particular cutline, counting the number of nets that have circuit elements in both the sub-regions defined by the particular cutline;

c) computing a cost estimate based on the counted numbers.

13. The method of claim 12, wherein computing a cost estimate comprises:

a) squaring each calculated number; and b) summing the squared calculated numbers to obtain a congestion cost estimate.

14. The method of claim 12 further comprising changing the positions of a set of circuit elements in said layout to reduce the number of nets intersected by said cutlines.

15. For an electronic design automation application, a placement method for defining the positions of circuit modules in an integrated circuit ("IC") layout, wherein the application defines a set of nets, and each net specifies a set of circuit elements in the layout, the method comprising a) defining a plurality of diagonal cutlines and a plurality of non-diagonal cutlines, wherein each cutline partitions the IC layout into two sub-regions;

b) for each cutline, computing the number of nets that have circuit elements in both the sub-regions defined by the particular cutline;

c) squaring each computed number;

d) adding the squared computed numbers to obtain a congestion cost estimate;

e) changing the positions of the circuit modules in the IC layout to reduce the congestion cost estimate.

16. The method of claim 15, wherein said plurality of non-diagonal cutlines includes horizontal lines.

17. The method of claim 15, wherein said plurality of non-diagonal cutlines includes vertical lines.

* * * * *